United States Patent
Oyama et al.

(10) Patent No.: US 10,683,184 B2
(45) Date of Patent: Jun. 16, 2020

(54) COMPONENT SUPPLYING DEVICE FOR A COMPONENT SUPPLY TAPE

(71) Applicant: YAMAHA HATSUDOKI KABUSHIKI KAISHA, Shizuoka (JP)

(72) Inventors: Kazuyoshi Oyama, Iwata (JP); Yasuyoshi Hongashi, Iwata (JP); Tsutomu Yanagida, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 275 days.

(21) Appl. No.: 15/578,188

(22) PCT Filed: Jun. 2, 2015

(86) PCT No.: PCT/JP2015/065912
§ 371 (c)(1),
(2) Date: Nov. 29, 2017

(87) PCT Pub. No.: WO2016/194142
PCT Pub. Date: Dec. 8, 2016

(65) Prior Publication Data
US 2018/0148289 A1    May 31, 2018

(51) Int. Cl.
*B65H 20/22* (2006.01)
*H05K 13/04* (2006.01)
*H05K 13/02* (2006.01)

(52) U.S. Cl.
CPC ......... *B65H 20/22* (2013.01); *H05K 13/0215* (2018.08); *H05K 13/0417* (2013.01);
(Continued)

(58) Field of Classification Search
CPC .. H05K 13/02; H05K 13/022; H05K 13/0215; H05K 13/0417; H05K 13/0418;
(Continued)

(56) References Cited

U.S. PATENT DOCUMENTS 6,789,720 B2 * 9/2004 Uchida ................ B23K 3/0669
228/22
6,952,869 B2 * 10/2005 Suhara ................. H05K 13/041
29/740
(Continued)

FOREIGN PATENT DOCUMENTS

JP    2005-539370 A    12/2005
JP    2014-011328 A    1/2014
(Continued)

OTHER PUBLICATIONS

An Office Action mailed by the Japanese Patent Office dated Dec. 4, 2018, which corresponds to Japanese Patent Application No. 2017-521395 and is related to U.S. Appl. No. 15/578,188.
(Continued)

*Primary Examiner* — Carl J Arbes
(74) *Attorney, Agent, or Firm* — Studebaker & Brackett PC

(57) ABSTRACT

A component supplying device includes a body portion including a component pick-up position, a tape path, first and second transfer portions, a control portion, and an input portion. The control portion includes a discharge processing portion which executes a discharge process in response to an instruction at the input, and a transfer processing portion which executes a transfer process after the discharge process. In the discharge process, a first component supply tape is transferred by the first transfer portion away from the first transfer position so that at least a part of the first component supply tape is discharged outside the body portion while holding the components. In the transfer process, a second component supply tape that is at the second transfer position is transferred by the second transfer portion toward the first transfer position, and transferred by the first transfer portion toward the component pick-up position.

20 Claims, 28 Drawing Sheets

(52) U.S. Cl.
CPC .. *H05K 13/0419* (2018.08); *B65H 2301/4128* (2013.01); *B65H 2701/1942* (2013.01)

(58) Field of Classification Search
CPC .................. B65D 73/02; B65H 20/22; B65H 2301/4128; B65H 2701/1942
See application file for complete search history.

(56) References Cited

U.S. PATENT DOCUMENTS

| | | | | |
|---|---|---|---|---|
| 7,036,213 | B2* | 5/2006 | Kabeshita | .......... H05K 13/0061 29/740 |
| 2003/0230617 | A1* | 12/2003 | Saho | ...................... B65H 20/22 226/76 |
| 2013/0144953 | A1* | 6/2013 | Watanabe | ............. H04L 65/403 709/204 |
| 2015/0195964 | A1* | 7/2015 | Yamasaki | .......... H05K 13/0419 226/76 |
| 2015/0223373 | A1* | 8/2015 | Yamasaki | ............. B65H 20/20 226/76 |
| 2015/0351294 | A1* | 12/2015 | Yamasaki | .......... H05K 13/0408 156/714 |

FOREIGN PATENT DOCUMENTS

| | | |
|---|---|---|
| JP | 2014-011368 A | 1/2014 |
| JP | 2015-065381 A | 4/2015 |
| WO | 2014/002912 A1 | 1/2014 |
| WO | WO 2014/025120 A1 * | 2/2015 |

OTHER PUBLICATIONS

An Office Action mailed by the Korean Intellectual Property Office dated Apr. 10, 2019, which corresponds to Korean Patent Application No. 10-2017-7031850 and is related to U.S. Appl. No. 15/578,188.

International Search Report issued in PCT/JP2015/065912; dated Sep. 8, 2015.

An Office Action issued by the Chinese Patent Office dated Jul. 3, 2019, which corresponds to Chinese Patent Application No. 201580080548.4 and is related to U.S. Appl. No. 15/578,188; with English language translation.

An Office Action; "Notice of Reasons for Refusal," issued by the Japanese Patent Office dated Jul. 2, 2019, which corresponds to Japanese Patent Application No. 2017-521395 and is related to U.S. Appl. No. 15/578,188; with English language translation.

An Office Action mailed by the Korean Intellectual Property Office dated Oct. 29, 2019, which corresponds to Korean Patent Application No. 10-2017-7031850 and is related to U.S. Appl. No. 15/578,188.

* cited by examiner

COMPONENT SUPPLYING DEVICE FOR A COMPONENT SUPPLY TAPE

CROSS-REFERENCE TO RELATED APPLICATION

This application claims benefit of priority to International Patent Application No. PCT/JP2015/065912, filed Jun. 2, 2015, the entire content of which is incorporated herein by reference.

TECHNICAL FIELD

The present technology described in this specification relates to a component supplying device, a surface mounting device including the component supplying device, and a method of supplying components.

BACKGROUND

A component supplying device including a feeder that feeds a component supply tape having electronic components thereon to a component pick-up position has been known as an example of a component supplying device that supplies electronic components in a surface mounting device for mounting the electronic components on a printed board. Each of the electronic components picked up at the component pick-up position in the feeder is mounted on the printed board by a component mounting device included in the surface mounting device.

In a mounting operation of mounting the electronic components on the printed board, a model of the electronic components that are to be mounted on the printed board may be changed when a model of the printed boards is changed. In such a case, another component supply tape having electronic components different from those of the previous component supply tape is required to be set in the feeder and the other component supply tape is required to be fed to the component pick-up position. When the model of the printed boards is changed, a discharge process (unloading operation) is required to be executed in the feeder such that the previous component supply tape is discharged outside the feeder.

For example, Japanese Unexamined Patent Publication No. 2014-11328 describes a feeder that can execute an unloading operation for the component supply tape that is in process and set in the feeder. In the feeder, the component supply tape is transferred in a direction opposite from a transfer direction in which the electronic components are supplied and is discharged outside the feeder and collected.

However, in the feeder described in Japanese Unexamined Patent Publication No. 2014-11328, when the model of the printed boards is changed, another component supply tape having electronic components different from those of the previous component supply tape is required to be fed to the component pick-up position with an operator's hand after the unloading operation of the previous component supply tape is executed. Therefore, in changing the model of the printed boards, a component replacement operation of replacing electronic components to be supplied takes labor and time.

SUMMARY

The technology disclosed herein was made in view of the above circumstances and an object is to provide a component supplying device with which a time for a component replacement operation is shortened, a surface mounting device including such a component supplying device, and a method of supplying components with which a time for a component replacement operation is shortened.

Technology described in this specification relates to a component supplying device transferring a component supply tape having components thereon and supplying the components. The component supplying device includes a body portion including a component pick-up position on a downstream side of a transfer direction in which the component supply tape is transferred for supplying the components, the components being supplied at the component pick-up position, a tape path included in the body portion and along which the component supply tape is transferred, a first transfer portion transferring the component supply tape disposed at a first transfer position that is on a downstream side of the transfer direction on the tape path, a second transfer portion transferring the component supply tape disposed at a second transfer position toward the first transfer position, the second transfer position being on an upstream side of the transfer direction on the tape path, a control portion configured to control the first transfer portion and the second transfer portion, and an input portion configured to receive input from outside of the component supply device. The control portion includes a discharge processing portion configured to execute a discharge process and a transfer processing portion configured to execute a transfer process. In the discharge process, a first component supply tape extending at least between the first transfer position and the component pick-up position is transferred by the first transfer portion to be away from the first transfer position so that at least a part of the first component supply tape on the tape path is discharged outside the body portion while holding the components thereon. In the transfer process, a second component supply tape that is disposed at the second transfer position is transferred by the second transfer portion toward the first transfer position, and the second component supply tape that reaches the first transfer position is transferred by the first transfer portion toward the component pick-up position. The discharge processing portion executes the discharge process if a predefined instruction is input to the input portion, and the transfer processing portion executes the transfer process subsequently to the discharge process after the discharge processing portion executes the discharge process if the predefined instruction is input to the input portion.

According to the component supplying device, in the discharge process, the first component supply tape at least a part of which is discharged outside the body portion is away from the first transfer position. Therefore, the first component supply tape is successively transferred by dropping with its own weight or using other transfer mechanism included in the body portions so that a whole of the first component supply tape is discharged outside the body portion. In the discharge process, the first component supply tape is discharged while holding the electronic components thereon and therefore, the first component supply tape is collected while holding the electric components that are not supplied at the component pick-up position and remain thereon. In the transfer process, the second component supply tape that is at the second transfer position is transferred to the component supply position by the second transfer portion.

Further, according to the component supplying device, the discharge process and the transfer process are successively performed if the predefined instruction is input to the input portion. Therefore, for example, the second component supply tape holding components different from those on the first component supply tape is arranged at the second transfer position and the predefined instruction is input to the input portion so that the replacement of the components that are supplied from the body portion is performed easily and quickly. As a result, compared to a prior configuration in that the second component supply tape is required to be transferred to the component pick-up position with an operator's hand after discharging the first component supply tape, the replacement of the component supply tape in the component replacement operation is performed easily and quickly and time for the component replacement operation is shortened.

The component supplying device may further include a mount member where a plurality of the body portions are mounted. The control portion may include a storing portion storing specifying data for specifying the body portions requiring execution of the discharge process among the plurality of the body portions mounted in the mount member if a predefined instruction is input to the input portion, and the discharge processing portion may execute the discharge process collectively for the body portions specified based on the specifying data among the plurality of the body portions mounted in the mount member if the predefined instruction is input to the input portion.

According to such a configuration, the storing portion stores the specifying data and if the predefined instruction is input, the discharge process is collectively performed for the body portions that are specified to require the component replacement among the body portions based on the specifying data. Subsequently to the discharge process, the transfer process is collectively performed for the body portions that are collectively subjected to the discharge process. Therefore, in the configuration including multiple body portions, the discharge process is not necessary to be performed multiple times for each of the body portions that require the component replacement operation. Therefore, time for the component replacement operation can be further shortened.

In the component supplying device, the tape path may include a first tape path, a second tape path, and a common tape path. The first tape path may be on the upstream side of the transfer direction, the second tape path may be on the upstream side of the transfer direction and away from the first tape path and include the second transfer position, and the common tape path may extend toward the downstream side of the transfer direction after the first tape path and the second tape path meet together, and the common tape path may include the first transfer position and the component pick-up position.

According to such a configuration, the second component supply tape can be previously arranged at the second transfer position on the second tape path, while the components are being supplied from the first component supply tape passing through the first tape path. Therefore, shifting from the discharge process to the transfer process can be smoothly performed. In the discharge process, the first component supply tape is transferred through the first tape path so that the first component supply tape can be discharged outside the body portion without contacting the second component supply tape. Thus, the discharge process can be performed smoothly.

According to the above configuration, the component replacement operation is performed smoothly and time for the component replacement operation can be further shortened. The first tape path may be separated from the second path by a part of the body portion or may be separated by another member different from the body portion and mounted in the body portion.

The component supplying device may further include a third transfer portion including an urging portion urging the component supply tape at a third transfer position on the first tape path, the urging portion urging the component supply tape at the third transfer position so that the third transfer portion transfers the component supply tape toward the upstream side from the downstream side of the transfer direction. The control portion may be configured to control the third transfer portion, and in the discharge process, the discharge processing portion may transfer the first component supply tape from the downstream side toward the upstream side of the transfer direction. The first component supply tape may extend over at least the first transfer position, the component pick-up position, and the third transfer position, and the urging portion may urge the first component supply tape at the third transfer position, and the third transfer portion may discharge the first component supply tape that is away from the first transfer position to the outside of the body portion from the upstream side of the transfer direction.

According to such a configuration, the first component supply tape that is not urged by the urging portion passes through the first tape path and the components can be supplied. In the discharge process that is performed during the component supply operation from the first component supply tape, the urging portion urges the first component supply tape so that the first component supply tape that is away from the first transfer position can be discharged outside the body portion from the upstream side by the third transfer portion. Therefore, in the discharge process, the whole of the first component supply tape can be discharged outside the body portion without using an operator's hand and the component replacement operation can be automated.

In the component supplying device, the body portion may include a path member that is configured to be switched between a first state and a second state. In the first state, a path connecting the common tape path and the first tape path may be formed by the path member at a meeting point of the first tape path and the second tape path by blocking a connection portion between the second tape path and the common tape path, and in the second state, the path member may not block the connection portion. The control portion may be configured to control the path member, and the discharge processing portion may be configured to switch the path member into the first state in the discharge process and switch the path member into the second state after the discharge process is terminated.

According to such a configuration, the path member is in the first state when the discharge process is performed. Even if the rear end portion of the first component supply tape is on the common tape path, the rear end portion of the first component supply tape that is transferred toward the upstream side in the discharge process is guided to the first tape path by the path formed by the path member. If the discharge process is finished, the path member is switched in the second state and does not block the connection point. Therefore, the second component supply tape that is previously arranged at the second transfer position can be smoothly transferred toward the component pick-up position after the discharge process is finished.

In the above configuration, even if the rear end portion of the first component supply tape is on the common tape path, the component replacement operation can be automated and a time for the component replacement operation can be shortened.

In the component supplying device, the first tape path may extend continuously from the common tape path and may be open downward of the body portion. The first tape path may be sloped downward from the upstream side toward the downstream side of the transfer direction such that the first component supply tape that is away from the first transfer position and on the common tape path drops by its own weight. The discharge processing portion may transfer the first component supply tape from the downstream side toward the upstream side of the transfer direction in the discharge process.

According to such a configuration, in the discharge process, the first component supply tape is transferred toward the upstream side such that the first component supply tape drops along the slope of the first tape path by its own weight and the whole of the first component supply tape can be discharged outside the body portion. Thus, the first component supply tape can be automatically discharged outside the body portion in the discharge process without providing another mechanism such as the third transfer portion for transferring the component supply tape toward the upstream side on the first tape path. As a result, the component replacement operation can be automated with a simple configuration and time required for the component replacement operation is shortened.

The component supplying device may further include a first detection portion detecting whether the component supply tape is on the first tape path. The discharge processing portion may transfer the component supply tape in the discharge process until the first detection portion does not detect at least the component supply tape.

According to such a configuration, in order to transfer the first component supply tape toward the upstream side in the discharge process, if the first detection portion detects that the first component supply tape is not on the first tape path in the discharge process, it is assumed that the first component supply tape is discharged outside the body portion from the upstream side of the body portion and the driving of the third transfer portion for transferring the first component supply tape on the first tape path in the discharge process is stopped. Thus, the mechanism is less likely to be driven unnecessarily.

In the component supplying device, the discharge processing portion may transfer the first component supply tape via the first transfer portion from the upstream side toward the downstream side of the transfer direction in the discharge process.

According to such a configuration, the first component supply tape is previously cut at the upstream side while keeping a length required for supplying the components. Accordingly, in the discharge process, the first component supply tape is transferred toward the downstream side and discharged outside the body portion. Thus, the first component supply tape can be automatically discharged outside the body portion in the discharge process without disposing the mechanism such as the third transfer portion on the first tape path. As a result, the component replacement operation can be automated with a simple configuration and time required for the component replacement operation is shortened.

The component supplying device may further include a second detection portion detecting whether the component supply tape is at a position on the common tape path and on the downstream side of the transfer direction than the first transfer position. The discharge processing portion may transfer the first component supply tape until the second detection portion does not detect at least the first component supply tape.

According to such a configuration, to transfer the first component supply tape toward the downstream side in the discharge process, the second detection portion detects that there is no first component supply tape at the position on the common tape path and on the downstream side from the component pick-up position, and it is assumed that the first component supply tape is discharged outside the body portion from the downstream side. Then, the driving of the mechanism such as the first transfer portion for transferring the first component supply tape on the common tape path in the discharge process is stopped. Therefore, the mechanism is less likely to be driven unnecessarily.

The component supplying device may further include a display portion including a display screen and a monitoring timer to which a predefined time is previously set. In the discharge process, the discharge processing portion may set the monitoring timer after the first transfer portion starts to transfer the first component supply tape, and if the second detection portion detects the first component supply tape, an error may be displayed on the display screen of the display portion if the predefined time has passed.

In the configuration in that the first component supply tape is transferred to the downstream side in the discharge process, the first component supply tape may continue to be transferred in the discharge process even though an error such that the first component supply tape is not previously cut is caused.

In the above configuration, if it is detected that the first component supply tape is on the downstream side of the component pick-up position even after the predetermined time that is set to the monitoring timer has passed, any error may be caused and an error is displayed on the display screen. Therefore, the first transfer portion is less likely to be driven unnecessarily.

Another technology described in this specification relates to a surface mounting device including the component supplying device, a base mount, a component mounting device configured to mount the component that is supplied from the component pick-up position on a board that is on a component mount position of the base mount, and a convey device configured to convey the board to the component mount position.

Another technology described in this specification relates to a method of supplying a component with using a component supplying device that transfers the component supply tape holding components thereon. The component supplying device includes a body portion including a component pick-up position on a downstream side of a transfer direction in which the component supply tape is transferred for supplying the components, the components being supplied at the component pick-up position, a tape path included in the body portion and along which the component supply tape is transferred, a first transfer portion transferring the component supply tape at a first transfer position that is on a downstream side of the transfer direction on the tape path, a second transfer portion transferring the component supply tape at a second transfer position toward the first transfer position, the second transfer position being on an upstream side of the transfer direction on the tape path. The method includes a discharge process in which a first component supply tape extending at least between the first transfer position and the component pick-up position is transferred by the first transfer portion and the first component supply tape on the tape path is discharged outside the body portion while holding the components thereon, and a transfer process in which a second component supply tape that is at the second transfer position is transferred by the second transfer portion toward the first transfer position, and the second component supply tape that reaches the first transfer position is transferred by the first transfer portion toward the component pick-up position. The transfer process is executed subsequently to the discharge process after the discharge process.

The method of supplying a component according may further include a cutting process in which the first component supply tape is cut outside the body portion and on the upstream side of the transfer direction before the discharge process. In the discharge process, the first component supply tape may be transferred by the first transfer portion from the upstream side toward the downstream side of the transfer direction.

In the method of supplying a component, in the discharge process, after the first component supply tape is transferred by the first transfer portion from the downstream side toward the upstream side of the transfer direction and is away from the first transfer position, a part of the first component supply tape extending from the downstream side of the transfer direction to outside of the body portion may be pulled such that a whole of the first component supply tape that is on the tape path may be discharged outside the body portion.

According to the present technology described in this specification, a component supplying device with which a time for a component replacement operation is shortened, a surface mounting device including such a component supplying device, and a method of supplying components with which a time for a component replacement operation is shortened are provided.

DETAILED DESCRIPTION

Figure 1:
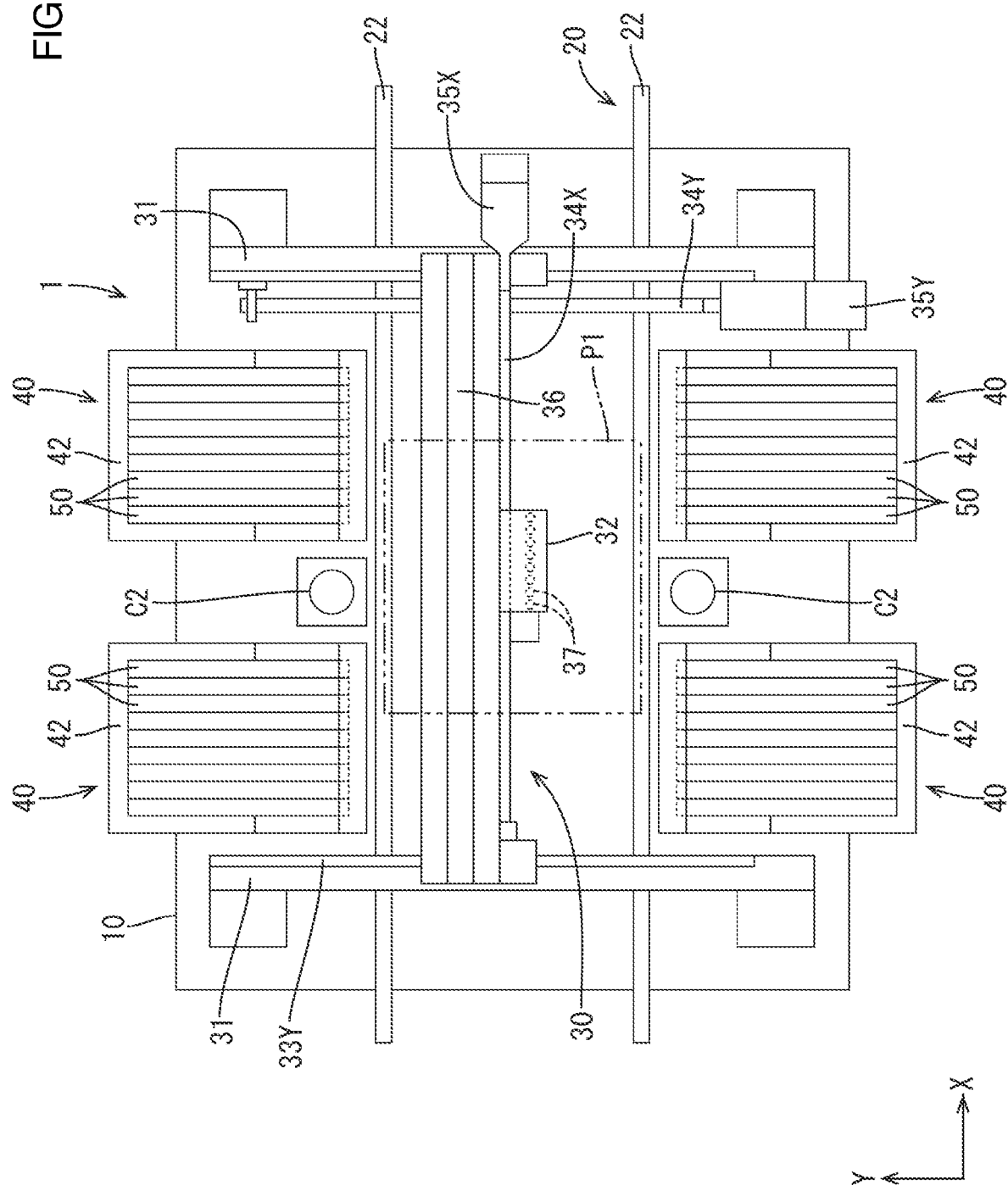
FIG. 1 is a plan view illustrating a surface mounting device.

First Embodiment (Whole Structure of Surface Mounting Device)

A first embodiment will be described with reference to FIGS. 1 to 9. In this embodiment, a surface mounting device 1 and a feeder-type supplying device (an example of a component supplying device) 40 included in the surface mounting device 1 illustrated in FIG. 1 will be described. The surface mounting device 1 of this embodiment includes a base mount 10, a transfer conveyer (an example of a conveyer device) 20 that conveys a printed board (an example of a printed board) P1, a component mounting device 30 that mounts an electronic component (an example of a component) E1 on the printed board P1, and the feeder-type supplying device 40 that supplies the electronic components E1 (see FIG. 4) to the component mounting device 30.

The base mount 10 has a rectangular plan-view shape and a flat upper surface. On the base mount 10, back-up pins (not illustrated) are disposed below the transfer conveyer 20 to support from a back side the printed board P1 on which the electronic component E1 is mounted. In the following description, a longitudinal direction of the base mount 10 (a left-right direction in FIG. 1) and a transfer direction of the transfer conveyer 20 correspond with an X-axis direction and a short-side direction of the base mount 10 (a vertical direction in FIG. 1) corresponds with a Y-axis direction, and a thickness direction of the base mount 10 (a vertical direction in FIG. 2) corresponds with a Z-axis direction.

The transfer conveyer 20 is arranged in a middle of the base mount 10 with respect to the Y-axis direction and conveys the printed board P1 in the transfer direction (the X-axis direction). The transfer conveyer 20 includes a pair of conveyer belts 22 that is driven to be circulated in the transfer direction. The printed board P1 is put on the conveyer belts 22 ranging from one of the conveyer belts 22 to another one. The printed board P1 is conveyed from one side (a right side in FIG. 1) in the transfer direction to a working position (an area surrounded by a two-dot chain line in FIG. 1) on the base mount 10 along the conveyer belts 22. The printed board P1 is stopped at the working position and the electronic components E1 are mounted thereon and discharged from another side (a left side in FIG. 1) along the conveyer belts 22.

The component mounting device 30 includes a pair of support frames 31, a head unit 32, and a head unit driving mechanism that are disposed above the base mount 10 and the feeder-type supplying device 40, which will be described later. The head unit driving mechanism is configured to drive the head unit 32. The support frames 31 are arranged on both sides of the base mount 10 with respect to the X-axis direction, respectively, and extend in the Y-axis direction. The support frames 31 include an X-axis servo mechanism and a Y-axis servo mechanism that configure the head unit driving mechanism. The head unit 32 is moved by the X-axis servo mechanism and the Y-axis servo mechanism in the X-axis direction and the Y-axis direction within a predefined movable area.

The Y-axis servo mechanism includes Y-axis guide rails 33Y, Y-axis ball screws 34Y where ball nuts are screwed (not illustrated), respectively, and a Y-axis servo motor 35Y. A head support member 36 is mounted on the Y-axis guide rails 33Y and is fixed on the ball nuts. If the Y-axis servo motor 35Y is driven with electric power, the ball nuts can be moved forward and backward along the Y-axis ball screws 34Y and the head support member 36 fixed on the ball nuts and the head unit 32 are moved in the Y-axis direction along the Y-axis guide rails 33Y.

Figure 5:
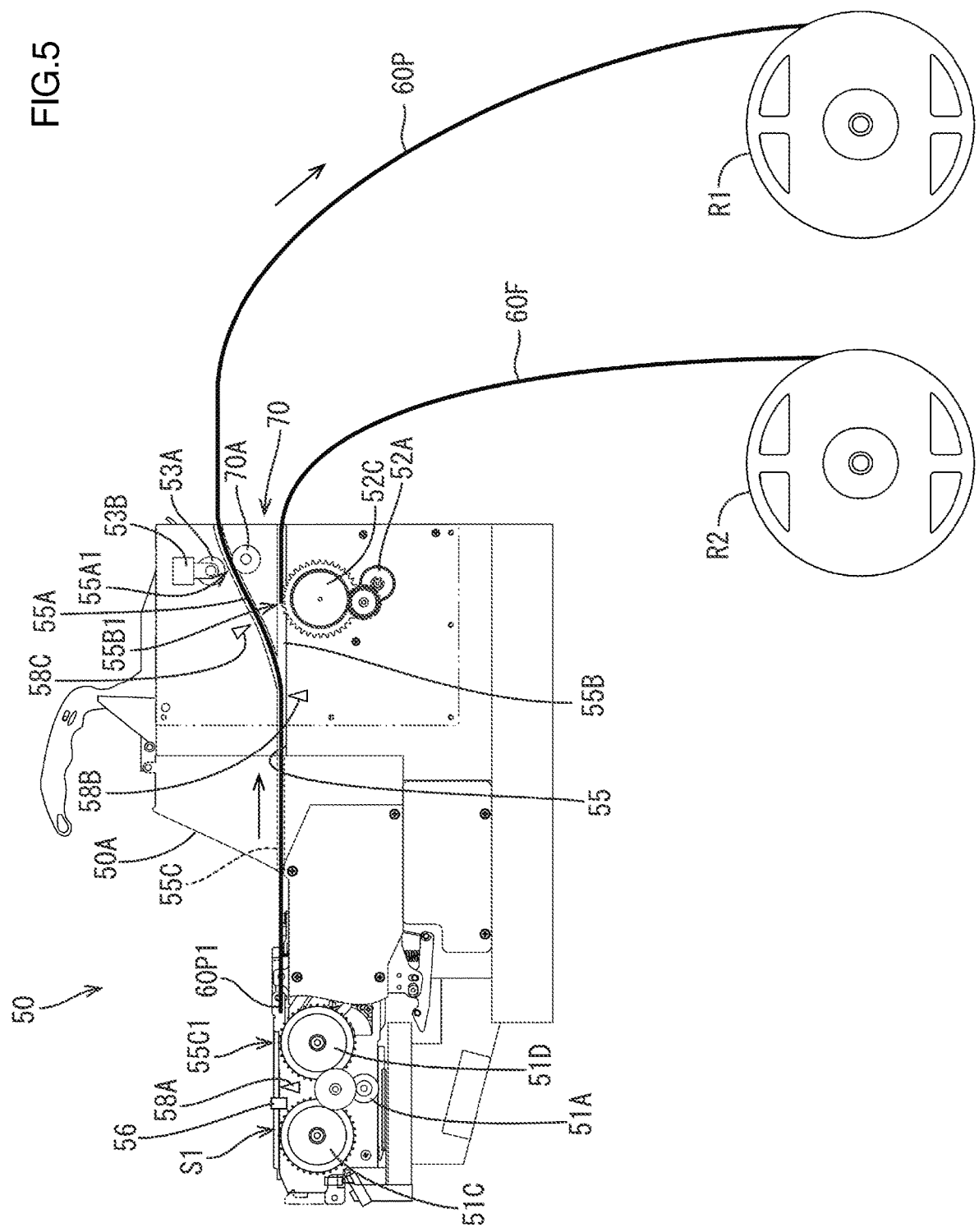
FIG. 5 is a side view illustrating a step (1) of a discharging method according to the first embodiment.

The X-axis servo mechanism includes X-axis guide rails (not illustrated), an X-axis ball screw 34X where a ball nut is screwed (not illustrated), and an X-axis servo motor 35X (see FIG. 5). A head unit 32 is mounted on the X-axis guide rails 33X to be movable along the axis of the X-axis guide rails 33X. If the X-axis servo motor 35X is driven with electric power, the ball nut can be moved forward and backward along the X-axis ball screw 34X and the head unit 32 that is fixed on the ball nut is moved in the X-axis direction along the X-axis guide rail 33X.

The head unit 32 picks up the electronic component E1 supplied by the feeder-type supplying device 40 and mounts the electronic component E1 on the printed board P1. The head unit 32 includes mount heads 37 arranged in a line and the mount heads 37 perform mounting of the electronic components E1. Each of the mount heads 37 projects downward from the head unit 32 and includes a suction nozzle (not illustrated) at a distal end thereof and the electronic component E1 is suctioned by the suction nozzle with negative pressure. Each of the mount heads 37 is rotatable around a shaft thereof by an R-axis servo motor 35R (see FIG. 5) and is moved vertically (can be lifted and lowered) with respect to the head unit 32 by driving of the Z-axis servo motor 35Z (see FIG. 5).

Figure 4:
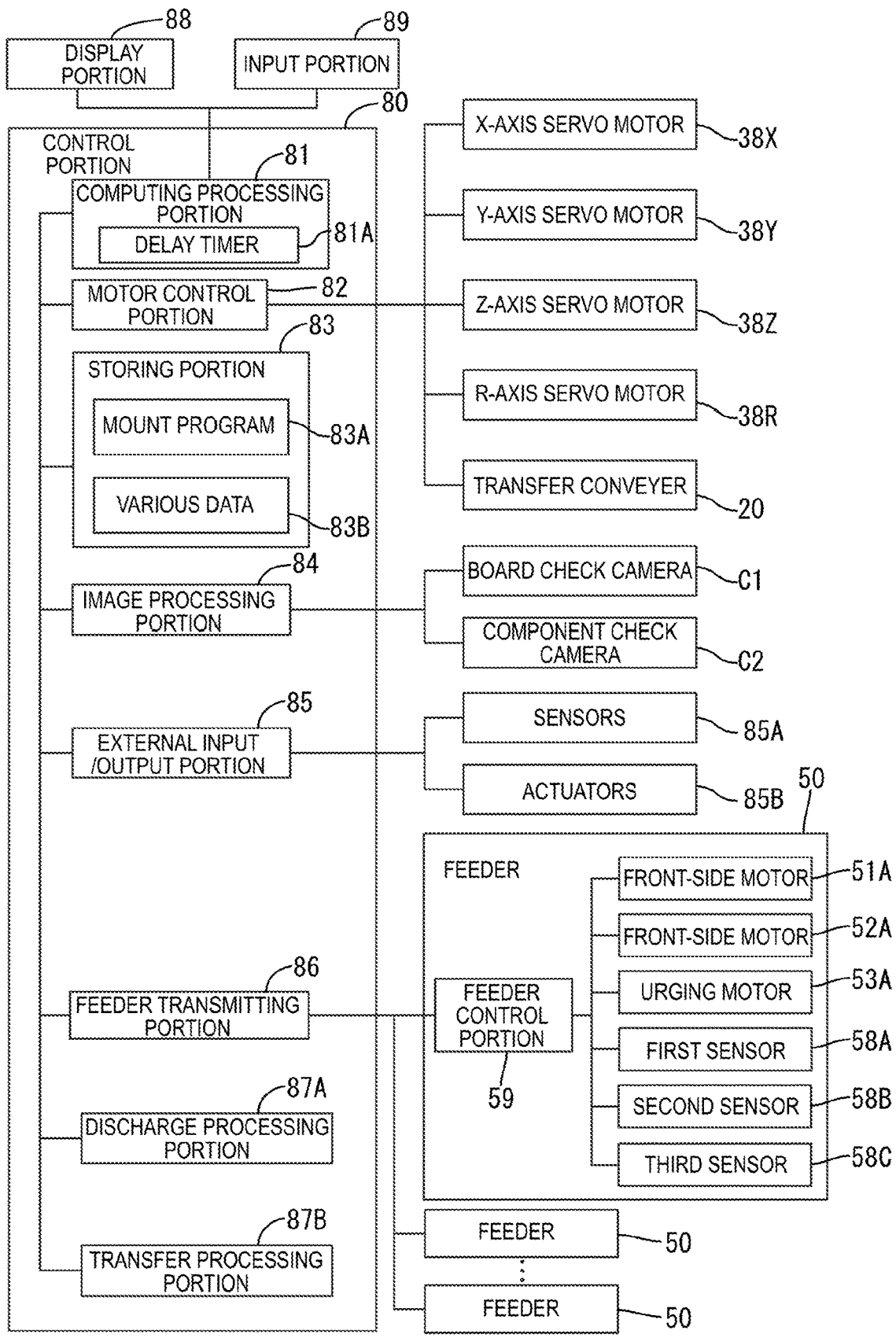
FIG. 4 is a block diagram illustrating an electric configuration of the surface mounting device.

The head unit 32 includes a board check camera C1 (see FIG. 4). The board check camera C1 is moved integrally with the head unit 32 and takes an image of any part of the printed board P1 that is stopped at the working position. Component check cameras C2 (see FIG. 1) are fixed on the base mount 10 near the working position. Each of the component check cameras C2 takes images of the electronic components E1 that are picked up by the mount head 37.

(Configuration of Feeder-Type Supplying Device)

Next, a configuration of the feeder-type supplying device 40 will be described. Two feeder-type supplying devices 40 are arranged in the X-axis direction on each of an upper side and a lower side with respect to the transfer conveyer 20 (in FIG. 1), and namely, a total of four feeder-type supplying devices 40 are arranged. The feeder-type supplying device 40 includes a feeder mount member (an example of a mount member) 42, a reel support member (not illustrated), and a transferring unit 70 arranged on a rear side of the feeder 50. The feeder-type supplying device 40 draws a component supply tape 60 from the reel support member.

In the following description, in the feeder-type supplying device 40, the feeder 50 has a front portion from which the electronic components E1 are supplied (that faces the transfer conveyer 20, a left side portion in each of the side views) and a rear portion that is an opposite portion from the front portion. A direction perpendicular to a front-rear direction (the Y-axis direction) and an upper-lower direction (the Z-axis direction) in the feeder 50 is a width direction (the X-axis direction, a width direction of a body portion 50A, a width direction of a component supply tape) in the feeder 50. Each of the feeders 50 transfers the component supply tape 60 from the rear portion toward the front portion thereof. The component supply tape 60 is transferred in a transfer direction from the rear portion thereof as an upstream side and the transfer direction matches the front-rear direction of the feeder 50.

Figure 2:
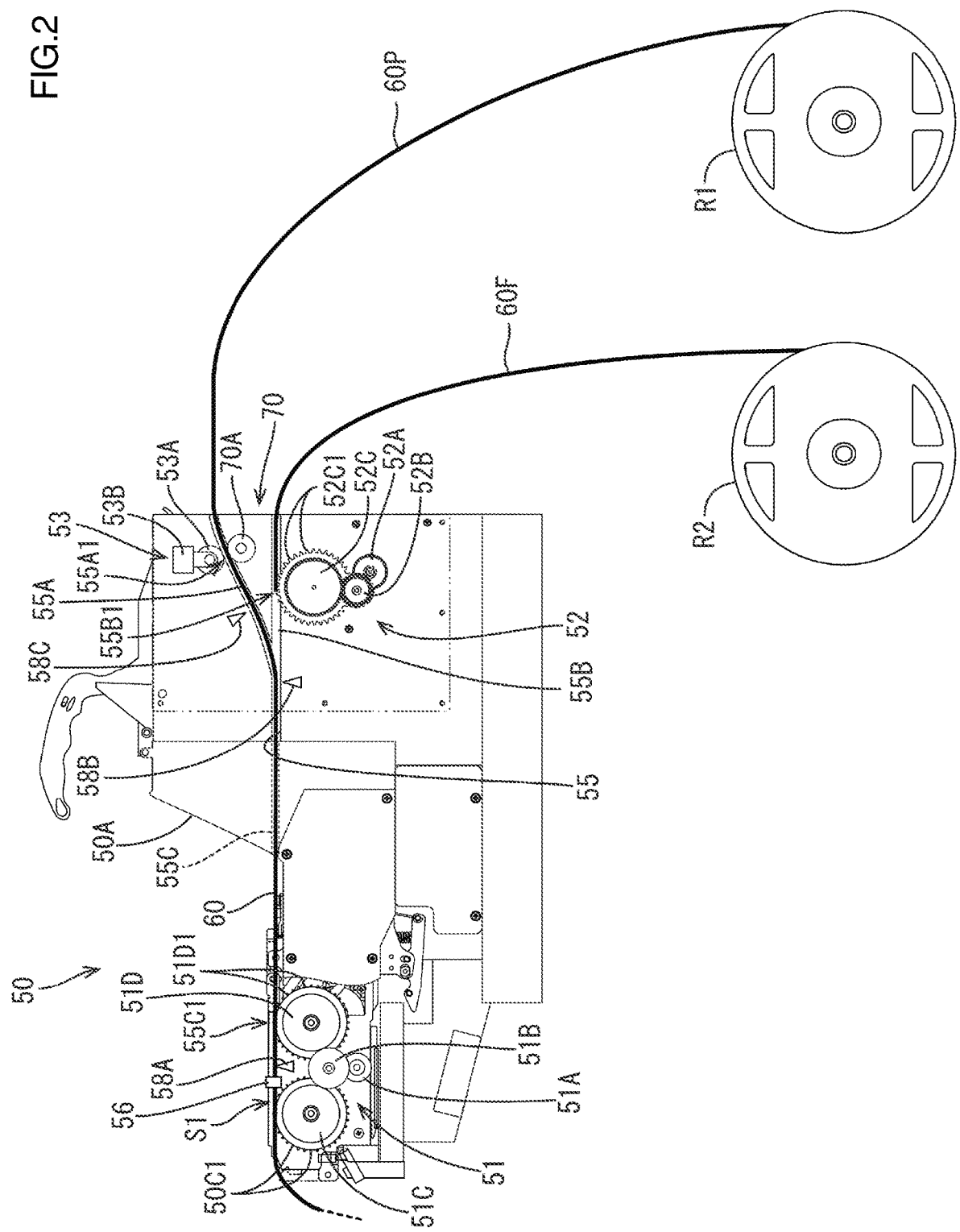
FIG. 2 is a side view schematically illustrating a feeder according to a first embodiment.

The feeders 50 are arranged laterally on the feeder mount member 42. Each of the feeders 50 feeds the component supply tape 60 having the electronic components E1 thereon toward a component pick-up position S1 that is located in the front portion of the feeder 50. The reel support member is arranged on a rear side with respect to the feeder mount member 42. As illustrated in FIG. 2, reels R1, R2 around which the component supply tapes 60 are wound are rotatably supported on the reel support member.

As illustrated in FIG. 2, the feeder 50 includes the body portion 50A, a front-side transfer portion (an example of a first transfer portion) 51, a rear-side transfer portion (an example of a second transfer portion) 52, a discharge portion (an example of a third transfer portion) 53, and further includes a tape path 55, an uncovered portion 56, a first sensor (an example of a second detection portion) 58A, a second sensor 58B, a third sensor (an example of a first detection portion) 58C, and a feeder control portion 59 (see FIG. 4) that are arranged in the body portion 50A. The body portion 50A is a feeder case and extends in the front-rear direction (the Y-axis direction). The front-side transfer portion 51 is arranged in the front portion of the body portion 50A and the rear-side transfer portion 52 is arranged in the rear portion of the body portion 50A. The discharge portion 53 is arranged in the rear portion of the body portion 50A.

Figure 3:
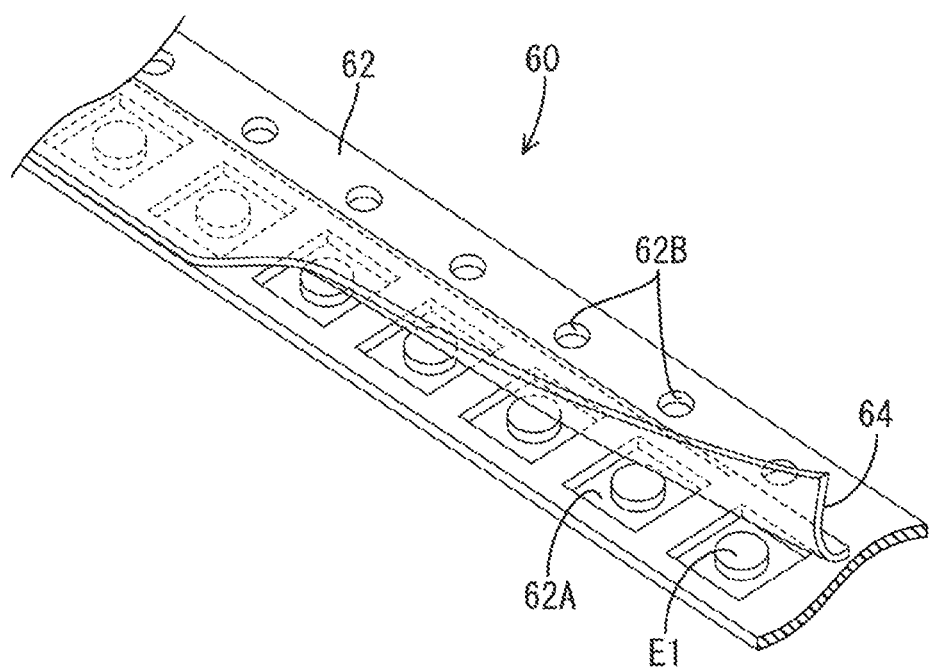
FIG. 3 is a perspective view illustrating a component supply tape having a top tape that is cut.

As illustrated in FIG. 3, the component supply tape 60 transferred by each feeder 50 is an elongated sheet extending in one direction and is made of synthetic resin, for example. The component supply tape 60 includes a carrier tape 62 and a top tape 64 attached on the carrier tape 62. The carrier tape 62 includes component storing portions 62A at a certain interval. The component storing portions 62A are recessed portions each of which opens upward. The electronic components E1 are arranged in the respective component storing portions 62A and sealed with the top tape 64 and stored therein. The carrier tape 62 has through holes 62B that are arranged at a certain interval along one side edge thereof.

The front-side transfer portion 51 of the feeder 50 includes a front-side motor 51A, a front-side driven gear 51B, a first sprocket 51C that is disposed in a front end portion of the body portion 50A, and a second sprocket 51D that is disposed in the front end portion of the body portion 50A and on a rear side with respect to the first sprocket 51C.

The front-side motor 51A is driven and rotated in a forward direction and in a reverse direction. The front-side driven gear 51B transfers power from the front-side motor 51A and rotates the first sprocket 51C and the second sprocket 51D in the same direction. As illustrated in FIG. 2, the component pick-up position S1 is located between the first sprocket 51C and the second sprocket and closer to the first sprocket 51C in each of the feeders 50.

The first sprocket 51C and the second sprocket 51D have teeth 51C1, 51D1 at an equal interval at each periphery thereof, respectively. The sprockets 51C, 51D are arranged such that a part of each of the teeth 51C1, 51D1 is exposed upward. In the front-side transfer portion 51, if the front-side motor 51A is driven and rotated in a forward direction, the sprockets 51C, 51D having the exposed teeth 51C1, 51D1 that are engaged in the through holes 62B of the component supply tape 60 are rotated in a counterclockwise direction in FIG. 2, and the component supply tape 60 is transferred forward.

The rear-side transfer portion 52 of the feeder 50 includes a rear-side motor 52A, a rear-side driven gear 52B, and a third sprocket 52C that is disposed in a rear end portion of the body portion 50A. The rear-side driven gear 52B transfers power from the rear-side motor 52A and rotates the third sprocket 52C.

The third sprocket 52C has teeth 52C1 at an equal interval at an outer periphery thereof and the teeth 52C1 are to be engaged in the through holes 62B of the component supply tape 60. The third sprocket 52C is arranged such that a part of the teeth 52C1 is exposed upward. In the rear-side transfer portion 52, if the rear-side motor 52A is driven and rotated, the third sprocket 52C having the exposed teeth 52C1 that are engaged in the through holes 62B of the component supply tape 60 are rotated in a counterclockwise direction in FIG. 2, and the component supply tape 60 is transferred toward the component pick-up position S1.

The discharge portion 53 includes an urging motor (an example of an urging portion) 53A that can be lifted and lowered in an upper-lower direction, and a lifting/lowering portion 53B that rotatably supports the urging motor 53A and lifts or lowers the urging motor 53A vertically. The urging motor 53A is lowered by the lifting/lowering portion 53B such that the component supply tape 60 is held between a guide roller 70A of the transferring unit 70, which will be described later, and the urging motor 53A. Thus, the component supply tape 60 is urged by the urging motor 53A. In the discharge portion 53, the component supply tape 60 that is urged by the urging motor 53A is transferred rearward if the urging motor 53A is driven and rotated in a counterclockwise direction in FIG. 2.

The component supply tape 60 passes through the tape path 55. The tape path 55 extends through the body portion 50A in the front-rear direction from the rear end portion to the front end portion of the body portion 50A. The front portion of tape path 55 is open upward and includes the component pick-up positon 51 and the uncovered portion 56, which will be described later. The component supply tape 60 drawn from the reel R1, R2 enters the tape path 55 from the rear portion of the body portion 50A of each feeder 50 and exits the tape path 55 at the front end portion of the body portion 50A to the front side of the body portion 50A.

The tape path 55 is branched at the rear end portion thereof into an upper side and a lower side and the transferring unit 70, which will be described later, is mounted in the rear end portion of the tape path 55. Accordingly, as illustrated in FIG. 2, the tape path 55 is branched into an upper path extending upward obliquely from the front side to the rear side and a lower path extending in the front-rear direction by the transferring unit 70. In the following, between the two paths branched by the transferring unit 70, the upper path is a first tape path 55A and the lower path is a second path 55B. The tape path 55 includes a common tape path 55C extending in the front-rear direction from a point where the first tape path 55A and the second path 55B meet toward the front end portion of the body portion 50A.

In the body portion 50A of each feeder 50, the component supply tape 60 passing through the common tape path 55C is engaged with the second sprocket 51D at a first transfer position 55C1 on the common tape path 55C. The component supply tape 60 passing through the second tape path 55B is engaged with the third sprocket 52C at a second transfer position 55B1 on the second tape path 55B. The component supply tape 60 passing through the first tape path 55A is urged by the urging motor 53A at a discharge position (a third transfer position) 55A1 on the first tape path 55A.

As illustrated in FIG. 2, the uncovered portion 56 is included in a portion on the common tape path 55C that is between the first sprocket 51C and the second sprocket 51D and on a rear side with respect to the component pick-up position S1. A cutting mechanism, which is not illustrated, is arranged in a portion of the uncovered portion 56 so as to be opposite the common tape path 55C. Therefore, the top tape 64 of the component supply tape 60 passing through the uncovered portion 56 is cut by the cutting mechanism and the electronic components E1 stored in the component storing portion 62A are exposed.

In this embodiment, as illustrated in FIG. 3, after the top tape 64 is cut by the cutting mechanism, the top tape 64 is folded back in one direction with respect to a width dimension of the carrier tape 62 and transferred together with the carrier tape 62. Accordingly, the component supply tape 60 having the top tape 64 that is cut is transferred to the component pick-up position S1 with the electronic components E1 being exposed outside (uncovered). The mount head 37 is moved to the component pick-up position S1 at the same timing as the electronic component E1 is transferred to the component pick-up position S1, and the electronic component E1 is picked up from the component storing portion 62A of the carrier tape 62.

The first sensor 58A is arranged between the first sprocket 51C and the second sprocket 51D on the common tape path 55C and on a rear side with respect to the uncovered portion 56 so as to be opposite the common tape path 55C. The first sensor 58A detects the component supply tape 60 between the first sprocket 51C and the second sprocket 51D.

The second sensor 58B is arranged on the common tape path 55C so as to be opposite a meeting position where the first tape path 55A meets the second tape path 55B and detects the component supply tape 60 at the meeting position.

The third sensor 58C is arranged on the first tape path 55A and on a front side portion with respect to the discharge position 55A1 so as to be opposite the first tape path 55A and detects the component supply tape 60 at the front side position.

As illustrated in FIG. 2, the transferring unit 70 is a unit member having a substantially triangular side view shape and is detachably mounted in the rear end portion of the body portion 50A of each feeder 50. As described before, the tape path 55 branches into the first tape path 55A and the second tape path 55B at the rear end portion thereof since the transferring unit 70 is mounted in the rear end portion of the body portion 50A. The transferring unit 70 includes an idler guide roller 70A that guides transfer of the component supply tape 60 along the first tape path 55A.

In this embodiment, the front-side motor 51A, the rear-side motor 52A, and the urging motor 53A are driven and rotated at the same speed. Therefore, a time period required for transferring the component supply tape 60 from one position to another on the tape path 55 is easily calculated.

(Electric Configuration of Surface Mounting Device)

Next, an electric configuration of the surface mounting device 1 will be described with reference to FIG. 4. The surface mounting device 1 is controlled by a control portion 80, which can also be referred to as a "controller." The control portion 80 includes a computing processing portion 81 including a CPU. The computing processing portion 81 is connected to a motor control portion 82, a storing portion 83, an image processing portion 84, an external input/output portion 85, a feeder transmitting portion 86, a discharge processing portion 87A, a transfer processing portion 87B, a display portion 88, and an input portion 89. The computing processing portion 81 includes a delay timer 81A.

Predetermined time periods are set in the delay timer 81A included in the computing processing portion 81 and the predetermined time periods are as follows, for example. One of the predetermined time periods is a time period required for a distal end of the component supply tape 60 to pass through the first transfer position 55C1 after the distal end of the component supply tape 60 that is transferred back to the rear side along the tape path 55 is away from the position on the common tape path 55C where the first sensor 58A is arranged. Another one of the predetermined time periods is a time period required for the distal end of the component supply tape 60 to pass through the discharge position 55A1 after the distal end of the component supply tape 60 is away from the position on the first tape path 55A where the third sensor 58C is arranged. In the feeder 50 of this embodiment, a distance between the first sensor 58A and the first transfer position 55C1 and a distance between the third sensor 58C and the discharge position 55A1 are determined such that the two predetermined time periods are substantially equal to each other.

The motor control portion 82 is configured to drive the X-axis servo motor 35X and the Y-axis servo motor 35Y of the head unit 32 according to a mount program 83A, which will be described later. The motor control portion 82 is further configured to drive the Z-axis servo motor 35Z and the R-axis servo motor 35R of each mount head 37. The motor control portion is further configured to drive the transfer conveyer 20 according to the mount program 83A.

The storing portion 83 includes a read only memory (ROM) and a random access memory (RAM) and stores the mount program 83A and various data 83B. The mount program 83A stored in the storing portion 83 stores board information as to a model and the production number of the printed boards P1 where objects to be mounted, and component information as to the number and a model of the electronic components E1 that are to be mounted on the printed boards P1. Various data 83B stored in the storing portion 83 includes data as to the number and a model of the electronic components E1 provided in each of the feeders 50 included in the feeder-type supplying device 40.

The various data 83B stored in the storing portion 83 includes specifying data. Every time the model of the printed boards P1 is changed (hereinafter, referred to as model changing) during the electronic component E1 mounting operation according to the mount program 83A, one of the feeders 50 that is required to change the model of the electronic components set therein (hereinafter, referred to as replacement of components) according to the model of the printed boards P1 after model changing is specified (selected) based on the specifying data.

Image signals output from the board check camera C1 and the component check cameras C2 are input to the image processing portion 84. The image processing portion 84 is configured to analyze the images of the components and the boards based on the image signals from the cameras C1, C2.

The external input/output portion 85 is a so-called interface and configured to receive detection signals output from various sensors 85A arranged in the body of the surface mounting device 1. The external input/output portion 85 is configured to control performance of various actuators 85B arranged in the body of the surface mounting device 1 based on control signals output from the computing processing portion 81.

The feeder transmitting portion 86 is connected to the feeder control portion 59 of each of the feeders 50 included in the feeder-type supplying device 40 and controls the feeders 50. The feeder control portion 59 is arranged in a lower portion of each feeder 50 and is configured to control driving of the front-side motor 51A, the rear-side motor 52A, and the urging motor 53A arranged in the feeder 50. The feeder control portion 59 is connected to the first sensor 58A, the second sensor 58B, and the third sensor 58C arranged in the feeder 50 and receives detection signals output from each of the sensors 58A, 58B, 58C.

The discharge processing portion 87A is configured to discharge at least a part of the component supply tape 60 that is in the body portion 50A of the feeder 50 to the outside of the body portion 50A. The transfer processing portion 87B is configured to transfer the component supply tape 60 that is set at the second transfer position 55B1 toward the component pick-up position S1.

The display portion 88 includes a liquid crystal display device having a display screen and displays conditions of the surface mounting device 1. The display portion 88 includes a model changing lamp that notifies whether a model changing process, which will be described later, is being performed or not.

The input portion 89 includes a keyboard and is configured to receive input with a manual operation from outside. The input portion 89 includes a model changing button that receives input of instruction for performing the model changing process (an example of a predefined instruction), which will be described later. The display portion 88 and the input portion 89 are arranged outside the feeder-type supplying device 40 of the surface mounting device 1.

The surface mounting device 1 having the above configuration is alternately in a convey state in which the printed board P1 is conveyed by the transfer conveyer 20 and in a mounting state in which the electronic component E1 is mounted on the printed board P1 that is conveyed in the working position of the base mount during an automatic operation. Namely, a conveying operation and a mounting operation are alternately performed during the automatic operation of the surface mounting device 1.

If the model changing button of the input portion 89 is pressed by an operator in the mounting state, the control portion 80 is configured to collectively perform the discharge process and discharge at least a part of the previous component supply tape 60 out of the body portion 50A of each of the feeders 50 that are specified according to the above specifying data. In the feeders 50 where the discharge process has been performed, continuously from the discharge process, the control portion 80 is configured to collectively perform the transfer process and transfer a subsequent component supply tape 60F holding electronic components E1 that are different from those on the previous component supply tape toward the component pick-up position S1 for each of the feeders 50.

(Discharging Method and Conveyance Method)

The surface mounting device 1 and the feeder-type supplying device 40 according to this embodiment have the above configuration. Next, a discharging method of the discharge process in the feeder-type supplying device 40 of the first embodiment and the transferring method of the transfer process will be sequentially described. As illustrated in FIG. 2, in the body portion 50A of the feeder 50, the previous component supply tape (an example of a first component supply tape) 60P from which the electronic components E1 are being picked up at the component pick-up position S1 extends through the first tape path 55A and reaches the common tape path 55C without being urged by the urging motor 53A.

Prior to the discharge process, an operator inserts a distal end portion of the component supply tape (an example of a second component supply tape) 60F from the rear end portion of the feeder 50 into the second transfer position 55B1 while the electronic components E1 are being picked up from the previous component supply tape 60P. The component supply tape 60F holds electronic components E1 (electronic components E1 that are to be mounted on printed boards P1 after the model of the printed boards changed) different from those of the previous component supply tape 60P. The distal end portion of the subsequent component supply tape 60F is previously engaged with the third sprocket 52C (as illustrated in FIG. 2).

In the discharge process, the front-side motor 51A is driven and rotated in a reverse direction to rotate the first sprocket MC and the second sprocket 51D in a clockwise direction in FIG. 2. Accordingly, as illustrated in FIG. 5, the previous component supply tape 60P is transferred rearward and the front end portion 60P1 of the previous component supply tape 60P is released from the second sprocket 51D while holding the electronic components E1 thereon (a discharge process). Namely, the front end portion 60P1 is away from the first transfer position 55C1. The previous component supply tape 60P transferred rearward from the rear portion of the body portion 50A is wound around the reel R1.

Figure 6:
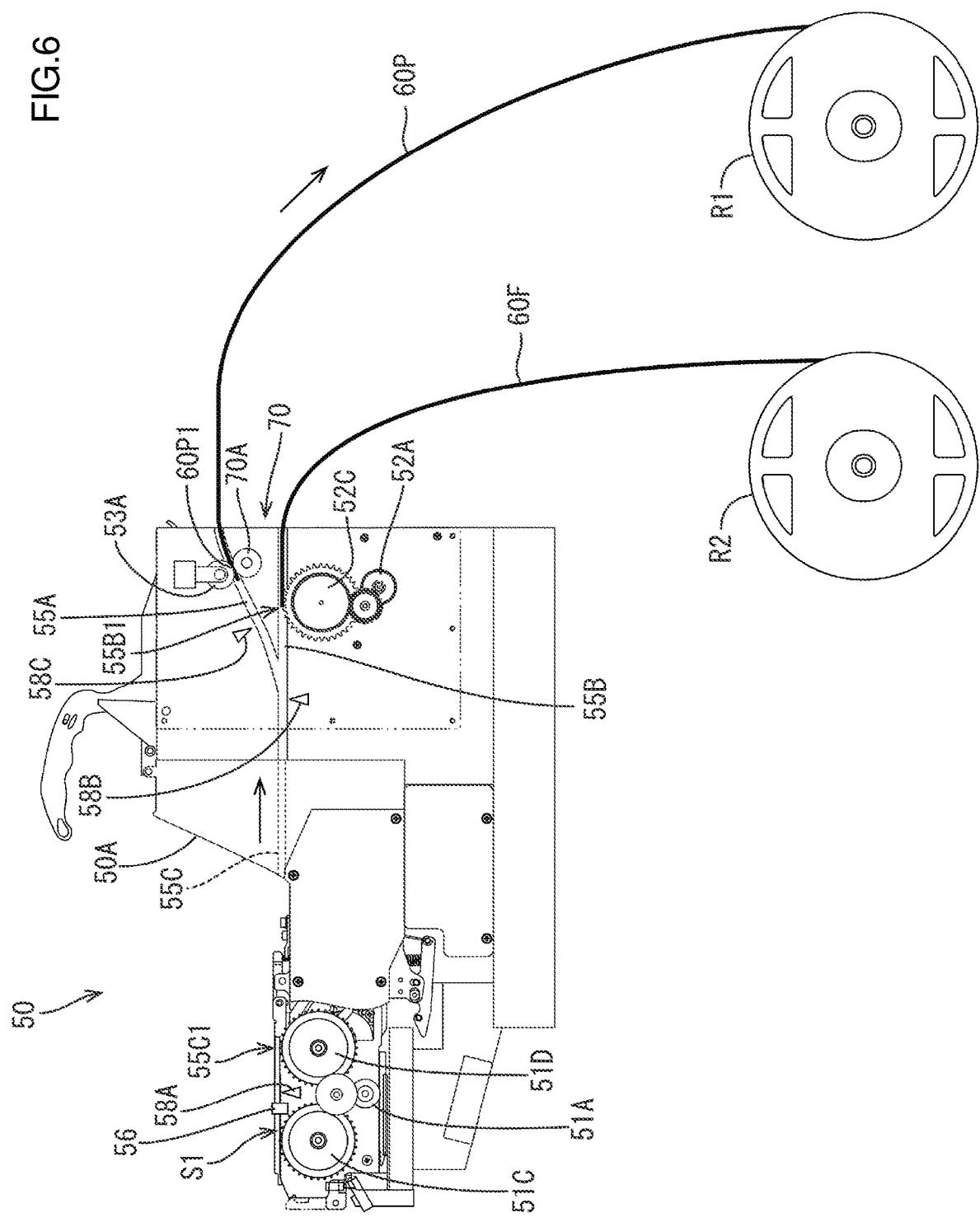
FIG. 6 is a side view illustrating a step (2) of the discharging method according to the first embodiment.

Next, the urging motor 53A is lowered to urge the previous component supply tape 60P and the urging motor 53A is driven and rotated. Accordingly, as illustrated in FIG. 6, the previous component supply tape 60P is further transferred rearward by the urging motor 53A. The front end portion of the previous component supply tape 60P is further transferred rearward by the urging motor 53A so that an entire previous component supply tape 60P is discharged outside the feeder 50. In this embodiment, the discharge process is performed according to the above steps.

Figure 7:
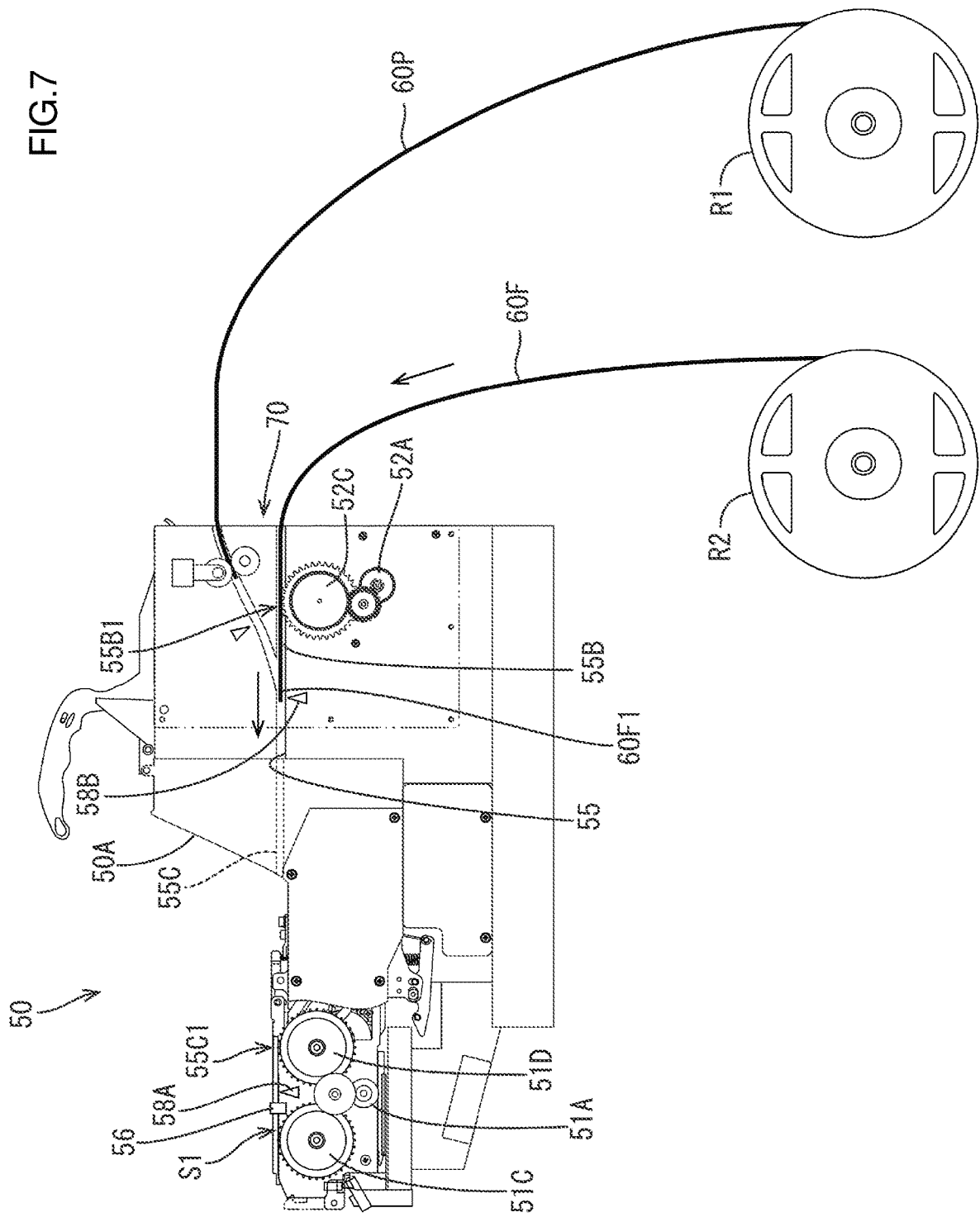
FIG. 7 is a side view illustrating a step (1) of a transferring method.
Figure 8:
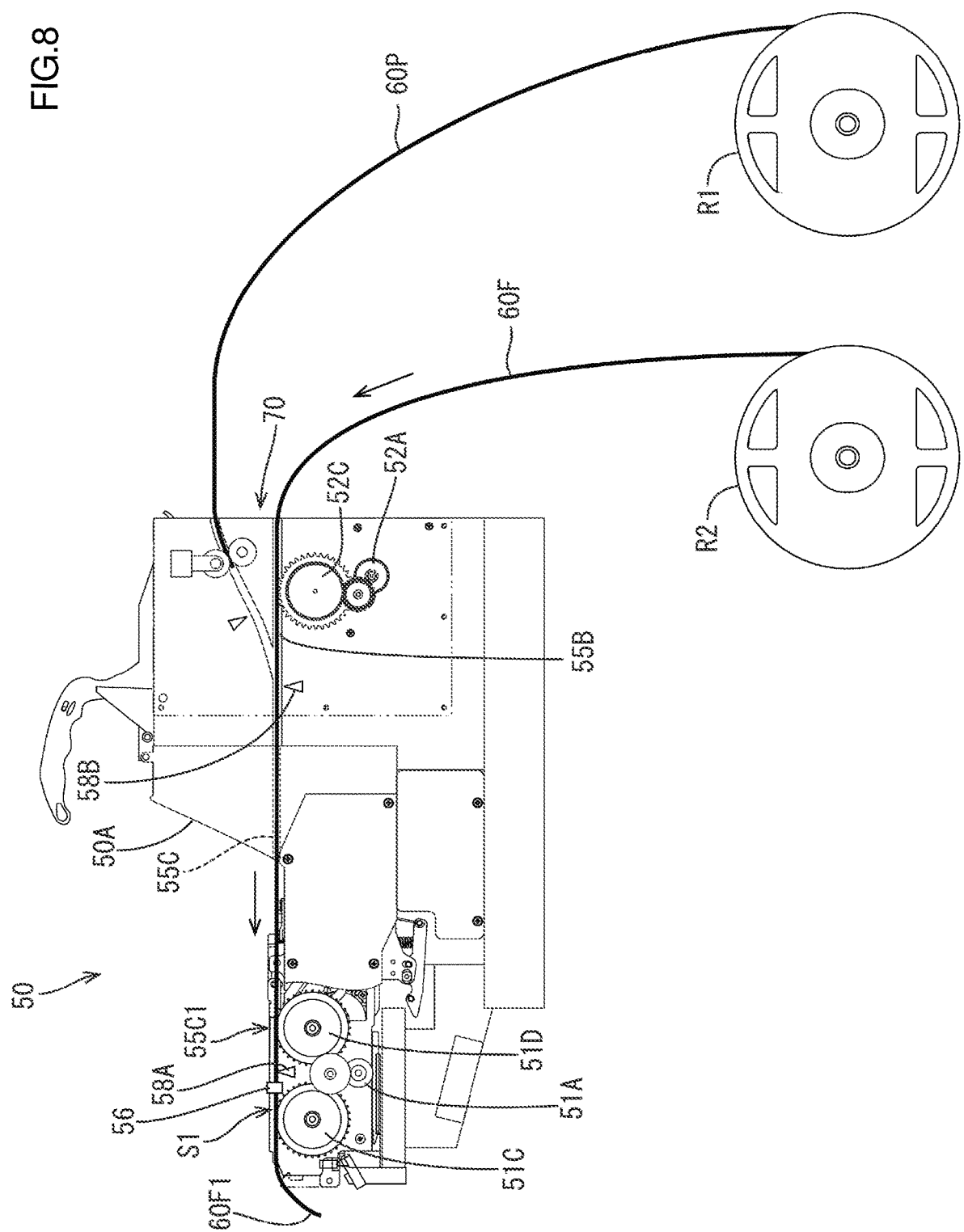
FIG. 8 is a side view illustrating a step (2) of the transferring method.

Next, in the transfer process, the rear-side motor 52A is driven and rotated in a forward direction so as to transfer forward the subsequent component supply tape 60F that is set in the second transfer position 55B, as illustrated in FIG. 7 (a transfer process). Accordingly, a front end portion 60F1 of the subsequent component supply tape 60F that is transferred forward from the second transfer position 55B1 reaches the first transfer position 55C1 and is engaged with the second sprocket 51D. Then, as illustrated in FIG. 8, the subsequent component supply tape 60F is transferred toward the component pick-up position by the second sprocket 51D. The transfer process is performed according to the above steps.

If the parts are replaced several times in the feeder 50, the following operations are performed after the transfer process. First, the transferring unit 70 is detached from the body portion 50A at the rear end portion thereof while the electronic components E1 are being supplied from the subsequent component supply tape 60F, and a portion of the subsequent component supply tape 60F that is on the second tape path 55B is lifted and placed on the transferring unit 70. Thereafter, the transferring unit 70 is mounted in the body portion 50A again.

Accordingly, the subsequent component supply tape 60F passes through the first path 55A and reaches the common tape path 55C. While the electronic components E1 are being supplied from the subsequent component supply tape 60F, a front end portion of a next component supply tape holding electronic components E1 that are different from those of the subsequent component supply tape 60 is engaged with the third sprocket 52C. Therefore, the discharge process and the transfer process are performed again.

(Processing Performed by the Control Portion)

Figure 9:
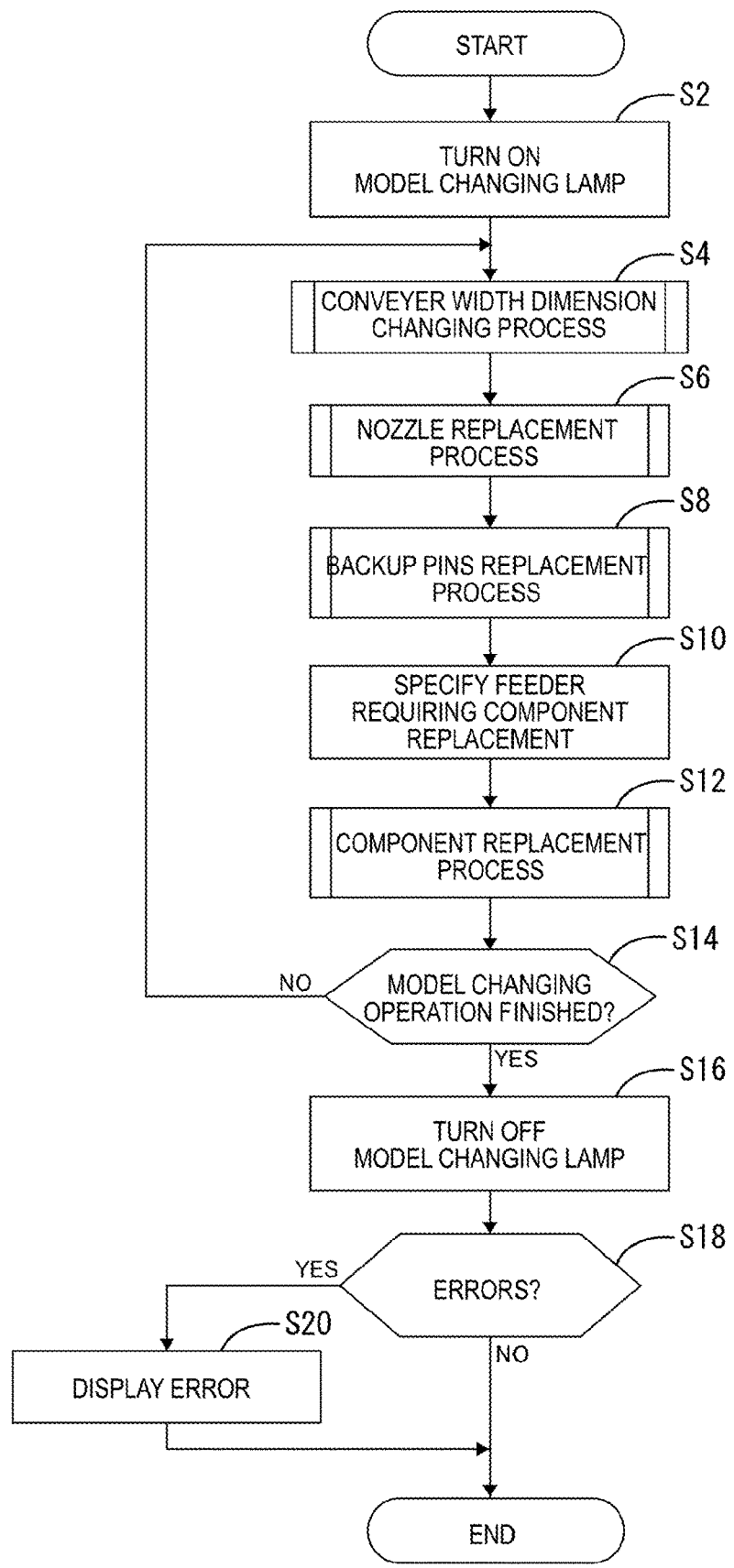
FIG. 9 is a flowchart illustrating a flow of a model changing process.

Next, the model changing process will be described with reference to a flowchart illustrated in FIG. 9. The model changing process is performed by the control portion 80 and the feeder control portion 59, when the model changing button pressed by an operator through the input portion 89 in the transfer state. In the model changing process, the control portion 80 turns on the model changing lamp on the display portion 88 (S2).

Next, the control portion 80 performs a conveyer width changing process in which a width dimension between the pair of conveyer belts 22 of the transfer conveyer 20 is changed to match a width of a printed board P1 after changing the model of the printed board (S4). Next, the control portion 80 performs a nozzle replacement process (S6). In the nozzle replacement process, the suction nozzle of each mount head 37 of the head unit 32 is replaced with another one to correspond with printed boards P1 after changing the model of the printed boards. Next, the control portion 80 performs a backup pin replacing process (S8) in which the backup pins are replaced with other ones to correspond with the backup of the printed boards P1 after changing the model of the printed boards.

Next, the control portion 80 reads the specifying data from the storing portion 83 and specifies at least one of the feeders 50 that requires component replacement (S10).

Next, the control portion 80 performs a component replacement process for the feeders 50 specified in S10 (S12). In the component replacement process, the control portion 80 performs the discharge process collectively for the feeders 50 specified in S10 and subsequently performs the transfer process collectively for the feeders 50. The discharge process and the transfer process performed in the component replacement process by the control portion 80 will be described in detail later. If the component replacement process is terminated, the process proceeds to S14.

In S14, the control portion 80 determines whether all the operations required for the model changing process (a model changing operation) are finished. If determining that the model changing operation is finished in S14 (S14:YES), the process proceeds to S16. If the control portion 80 determines that the model changing operation is not finished in S14 (S14:NO), the process returns to S4.

In S16, the control portion 80 turns off the model changing lamp and the process proceeds to S18. In S18, the control portion 80 determines whether each of the devices included in the surface mounting device 1 has malfunction. If determining that there is no malfunction in S18 (S18:NO), the control portion 80 terminates the model changing process. If determining that there is a malfunction in S18 (S18:YES), the control portion 80 displays an error on the display portion 88 (S20) and terminates the model changing process.

(Discharge Process)

Figure 10:
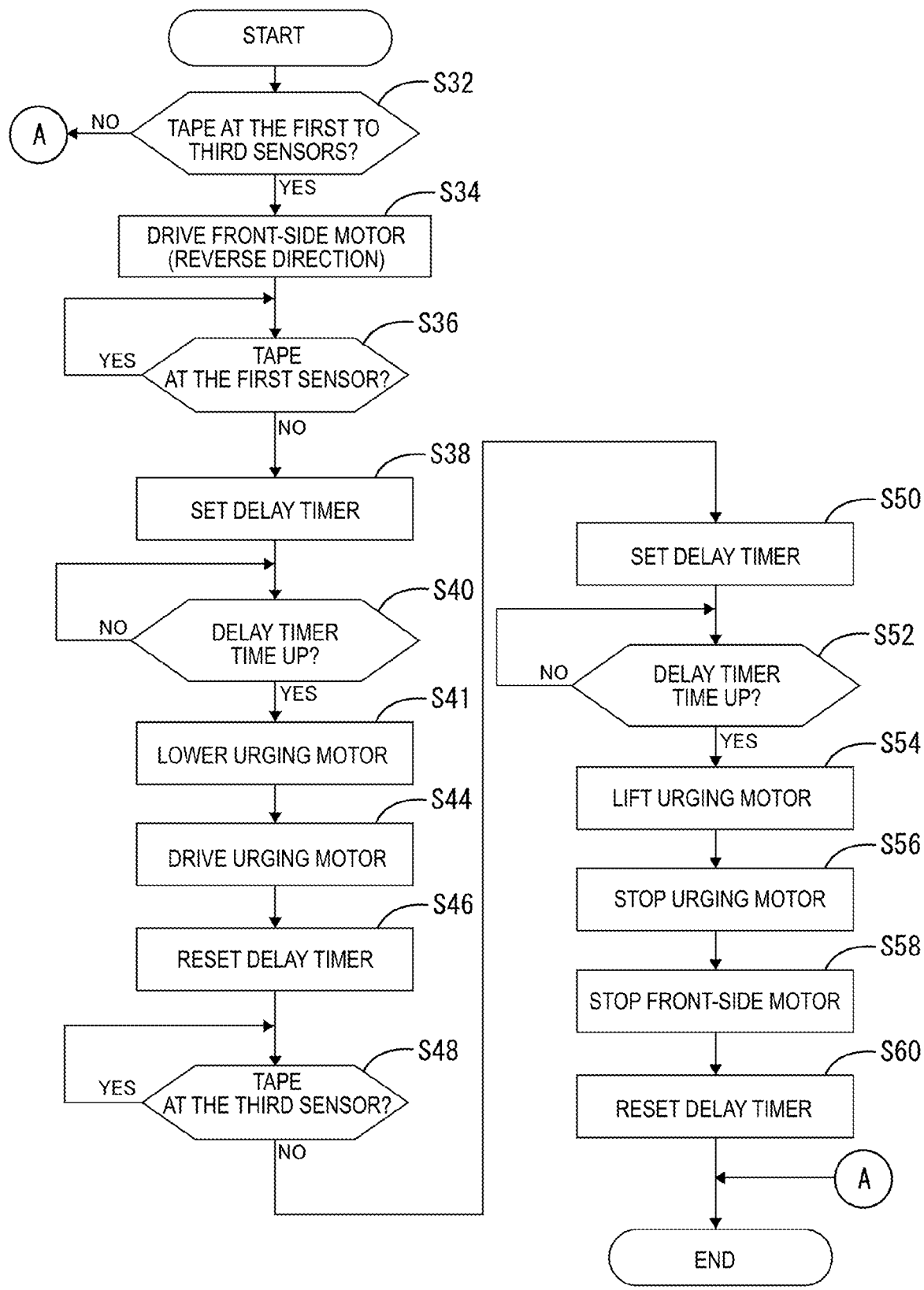
FIG. 10 is a flowchart illustrating a flow of a discharge process according to the first embodiment.

Next, the discharge process according to the first embodiment will be described with reference to a flowchart illustrated in FIG. 10. The discharge process is performed by the discharge processing portion 87A of the control portion 80 through the feeder control portion 59 and is performed in the component replacement process in S12. In the discharge process, the discharge processing portion 87A detects whether the component supply tape 60 is at the first sensor 58A, the second sensor 58B, and the third sensor 58C within the body portion 50A of the feeder 50 (S32).

If the discharge processing portion 87A determines in S32 that all of the first sensor 58A, the second sensor 58B, and the third sensor 58C detect the component supply tape 60 (S32:YES), the process proceeds to S34. If the discharge processing portion 87A detects no component supply tape 60 at at least one of the first sensor 58A, the second sensor 58B, and the third sensor 58C in S32 (S32:NO), the discharge process is terminated.

The discharge processing portion 87A drives and rotates the front-side motor 51A in a reverse direction and proceeds to S36. Thus, the previous component supply tape 60P that is at the first transfer position 55C1 is transferred rearward. The discharge process portion 87A determines whether the component supply tape 60 is detected by the first sensor 58A in S36.

If detecting that the component supply tape 60 at the first sensor 58A in S36 (S36:YES), the discharge processing portion 87A performs the process of S36 repeatedly. If the discharge processing portion 87A detects no component supply tape 60 at the first sensor 58A (S36:NO), the process proceeds to S38.

The discharge processing portion 87A sets the delay timer 81A that is included in the computing processing portion 81 (the delay timer 81A starts counting) and proceeds to S40. The discharge processing portion 87A determines whether time is up in the delay timer 81A (whether a counter of the delay timer 81A is zero) in S40.

If determining that time is up in the delay timer 81A in S40 (S40:YES), the discharge processing portion 87A assumes that the front end portion of the previous component supply tape 60P that is being transferred rearward passes the first transfer position 55C1 (is released from the second sprocket 51D) and proceeds to S42. If determining that the time is not up in the delay timer 81A in S40 (S40:NO), the discharge processing portion 87A performs the process of S40 repeatedly until the time is up in the delay timer 81A.

The discharge processing portion 87A controls the lifting/lowering portion 53B to lower the urging motor 53A in S42. Next, the discharge processing portion 87A drives and rotates the urging motor 53A (S44). Accordingly, the previous component supply tape 60P that is at the discharge position 55A1 is transferred rearward. Next, the discharge processing portion 87A resets the delay timer 81A (S46) and proceeds to S48.

The discharge processing portion 87A determines whether the third sensor 58C detects the component supply tape 60 in S48. If determining that the third sensor 58C detects the component supply tape 60 in S48 (S48:YES), the discharge processing portion 87A repeatedly performs the process of S48. If determining that the third sensor 58C does not detect the component supply tape 60 in S48 (S48:NO), the discharge processing portion 87A proceeds to S50.

The discharge processing portion 87A sets the delay timer 81A included in the computing processing portion 81 again in S50 and proceeds to S52. The discharge processing portion 87A determines whether time is up in the delay timer 81A in S52.

If determining that time is up in the delay timer 81A in S52 (S52:YES), the discharge processing portion 87A assumes that the front end portion of the previous component supply tape 60P that is being transferred rearward passes the discharge position 55A1 (is released from the urging motor 53A) and proceeds to S54. If determining that the time is not up in the delay timer 81A in S52 (S52:NO), the discharge processing portion 87A performs the process of S52 repeatedly until the time is up in the delay timer 81A.

The discharge processing portion 87A controls the lifting/lowering portion 53B to lift up the urging motor 53A in S54. Next, the discharge processing portion 87A stops driving of the urging motor 53A (S56), and stops driving of the front-side motor 51A (S58). Next, the discharge processing portion 87A resets the delay timer 81A (S60) and terminates the discharge process.

Figure 11:
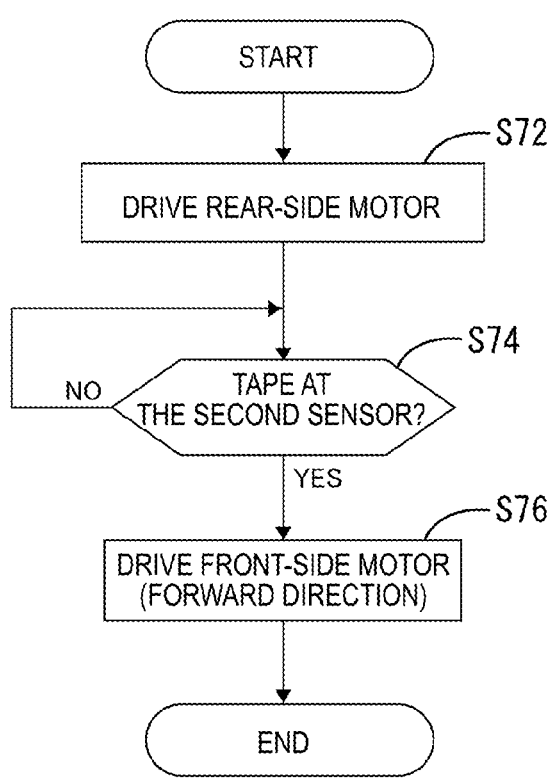
FIG. 11 is a flowchart illustrating a flow of a transfer process.

Next, the transfer process will be described with reference to a flowchart illustrated in FIG. 11. The transfer process is performed in the component replacement process. In the transfer process, the transfer processing portion 87B drives and rotates the rear-side motor 52A (S72) and proceeds to S74. Accordingly, the subsequent component supply tape 60F that is at the second transfer position 55B1 is transferred toward the first transfer position 55C1.

The transfer processing portion 87B determines whether the second sensor 58B detects the component supply tape 60 in S74. When detecting the component supply tape 60 at the second sensor 58B (S74: YES), the transfer processing portion 87B assumes that the front end portion of the subsequent component supply tape 60F reaches the common tape path 55C and proceeds to S76. If detecting that there is no component supply tape 60 at the second sensor 58B in S74 (S74:NO), the transfer processing portion 87B repeatedly performs the process of S74.

The transfer processing portion 87B drives and rotate the front-side motor 51A in a forward direction in S76 and terminates the transfer process. Accordingly, the front end portion 60F1 of the subsequent component supply tape 60F that reaches the first transfer position 55C1 is transferred to the component pick-up position S1 and the electronic components E1 are supplied from the subsequent component supply tape 60F.

(Effects of First Embodiment)

As described before, in the feeder-type supplying device 40 according to this embodiment, the front-side motor 51A is driven and rotated such that the previous component supply tape a part of which is discharged outside the feeder 50 is released from the second sprocket 51D. In the discharge process, the previous component supply tape 60P is discharged while holding the electronic components E1 thereon and therefore, the electronic components E1 remaining on the previous component supply tape 60P are not supplied at the component pick-up position S1. Therefore, the previous component supply tape 60P is collected while holding the electronic components E1 thereon. In the transfer process, the rear-side motor 52A is driven and rotated such that the subsequent component supply tape 60F that is previously engaged with the third sprocket 52 that is arranged in the rear portion of the feeder 50 is transferred to the component supply position S1 that is located in the front portion of the feeder 50.

The discharge process and the transfer process are successively performed if the model changing button of the input portion 89 is pressed by an operator during the operation of supplying the electronic components E1 from the previous component supply tape 60P. In the component replacement process when changing a model with the prior configuration, the subsequent component supply tape 60F is required to be transferred with an operator's hand or the whole body portion 50A of the feeder 50 is required to be replaced after the previous component supply tape 60P is discharged. Compared to such prior configurations, in the component replacement process of this embodiment, the replacement of the component supply tape 60 in the component replacement process is performed easily and quickly and time for the component replacement operation is shortened.

In this embodiment, the storing portion 83 of the control portion 80 stores the specifying data. If the model changing button is pressed, the discharge process is collectively performed for the feeder(s) 50 that is/are specified based on the specifying data, and subsequently to the discharge process, the transfer process is collectively performed for the feeder(s) 50 after the discharge process. Therefore, the discharge process is not necessary to be performed multiple times for every feeder 50 that requires the component replacement operation when changing the model. Therefore, time for the component replacement operation can be further shortened.

In this embodiment, the previous component supply tape 60P that is not urged by the urging motor 53A passes through the first tape path 55A and the electronic components E1 can be supplied at the component pick-up position S1. The subsequent component supply tape 60F can be previously arranged at the second transfer position 55B on the second tape path 55B, while the electronic components E1 are being supplied from the previous component supply tape 60P. Therefore, shifting from the discharge process to the transfer process can be smoothly performed.

In the discharge process according to this embodiment, the urging motor 53A urges the previous component supply tape 60P so that the previous component supply tape 60P that is released from the second sprocket 51D can be discharged outside the feeder 50 from the rear portion of the feeder 50 by the urging motor 53A. Therefore, in the discharge process, the whole of the previous component supply tape 60P can be discharged outside the feeder 50 without using an operator's hand and the component replacement operation can be automated.

In the discharge process according to this embodiment, after the urging motor 53A is driven, if the third sensor 58C detects that the previous component supply tape 60P is not on the first tape path 55A ant the time is up in the delay timer 81A, it is assumed that the front end portion 60P1 of the previous component supply tape 60P that is being transferred rearward passes the discharge position 55A1 (is separated from the urging motor 53A), the urging motor 53A is lifted up and the driving of the urging motor 53A is stopped. Thus, the urging motor 53A is less likely to be driven and rotated unnecessarily.

Second Embodiment

A second embodiment will be described with reference to FIGS. 12 to 15. A feeder-type supplying device according to the second embodiment includes a feeder 150 a part of which has a configuration different from that of the first embodiment. Other configurations of the feeder-type supply device and the configuration of the surface mounting device are same as those of the first embodiment and will not be described. The transfer process is common to the embodiments and will not be described.

Figure 12:
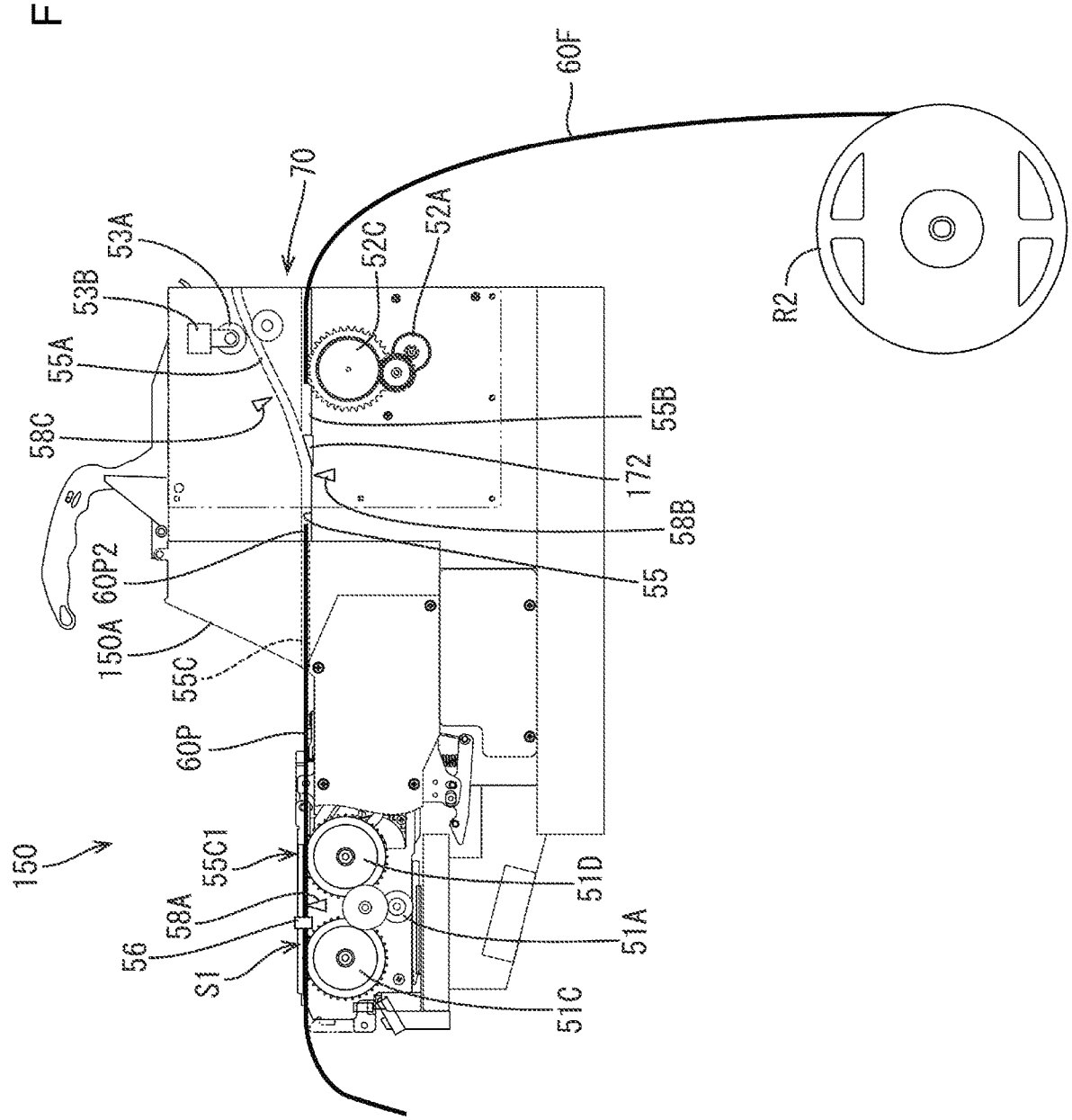
FIG. 12 is a side view schematically illustrating a feeder according to a second embodiment.

As illustrated in FIG. 12, a body portion 150A of the feeder 150 according to this embodiment includes a guide member (an example of a path member) 172 in addition to the configuration of the body portion 50A of the feeder 50 of the first embodiment. The guide member 172 is disposed at a meeting point of the first tape path 55A and the second tape path 55B within the body portion 150A and has a substantially triangular side view shape. The guide member 172 has an upper surface that is sloped surface sloped upward from the front side toward the rear side.

The guide member 172 is arranged at the meeting point so as to be moved up and down. The feeder control portion 59 controls the guide member 172 to be moved up and down. The guide member 172 is moved up by the feeder control portion 59 to block a connection point of the second tape path 55B and the common tape path 55C and connect the common tape path 55C and the first tape path 55A with the sloped surface. The sloped surface forms a path connecting the common tape path 55C and the first tape path 55A and the guide member 172 is in a first state (illustrated in FIG. 12). The guide member 172 is moved down by the feeder control portion 59 and is in a second state (illustrated in FIG. 14) in which the connection point is not blocked by the guide member 172.

In this embodiment, the feeder control portion includes a moving-up flag (not illustrated) that is used to determine whether the guide member 172 is moved up or not in the discharge process. The moving-up flag is set to on or off. The discharge process portion 87A determines the state of the moving-up flag.

(Discharging Method)

Next, a discharging method in the discharge process performed in the feeder-type supplying device according to the second embodiment will be described. The following configurations are common to each embodiment and will not be described. The previous component supply tape 60P passes through the first tape path 55A and reaches the common tape path 55C, and the front end portion of the subsequent component supply tape 60F is engaged with the third sprocket 52C while the electronic components E1 are supplied from the previous component supply tape 60P. Further, the second embodiment is based on the assumption that a rear end portion 60P2 of the previous component supply tape 60P is disposed on the common tape path 55C and the guide member 172 is moved down as illustrated in FIG. 12.

In the discharge process, the front-side motor 51A is driven and rotated in a reverse direction and the guide member 172 is moved up. Accordingly, the previous component supply tape 60P is transferred rearward, and if the rear end portion 60P2 of the previous component supply tape 60P reaches the guide member 172, the rear end portion 60P2 of the previous component supply tape 60P is guided to the first tape path 55A by the sloped surface of the guide member 172. The rear end portion 60P2 of the previous component supply tape 60P that is guided to the first tape path 55A is further transferred rearward and passes the discharge position 55A1 on the first tape path 55A.

Figure 13:
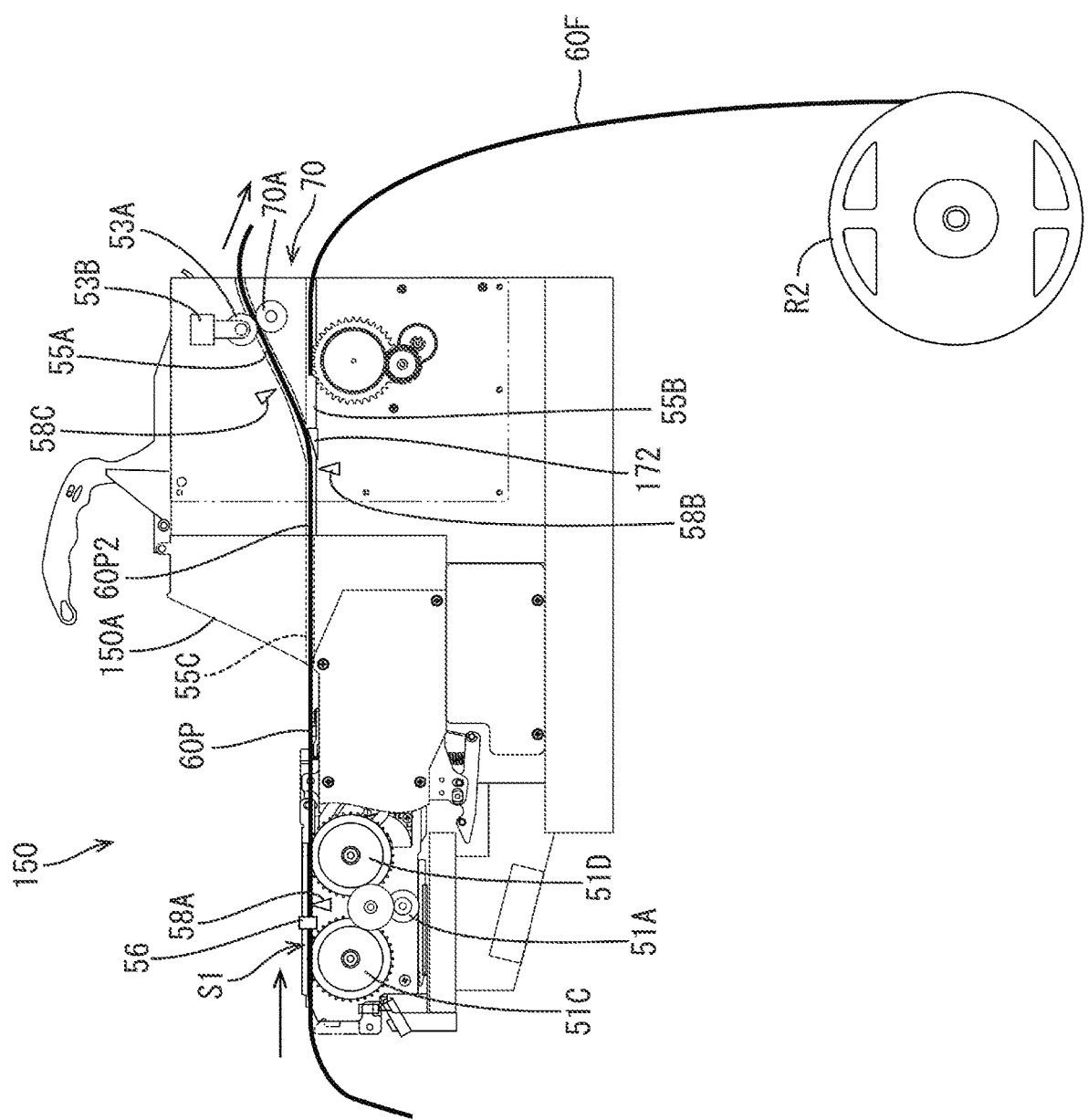
FIG. 13 is a side view illustrating a step (1) of a discharging method according to the second embodiment.
Figure 14:
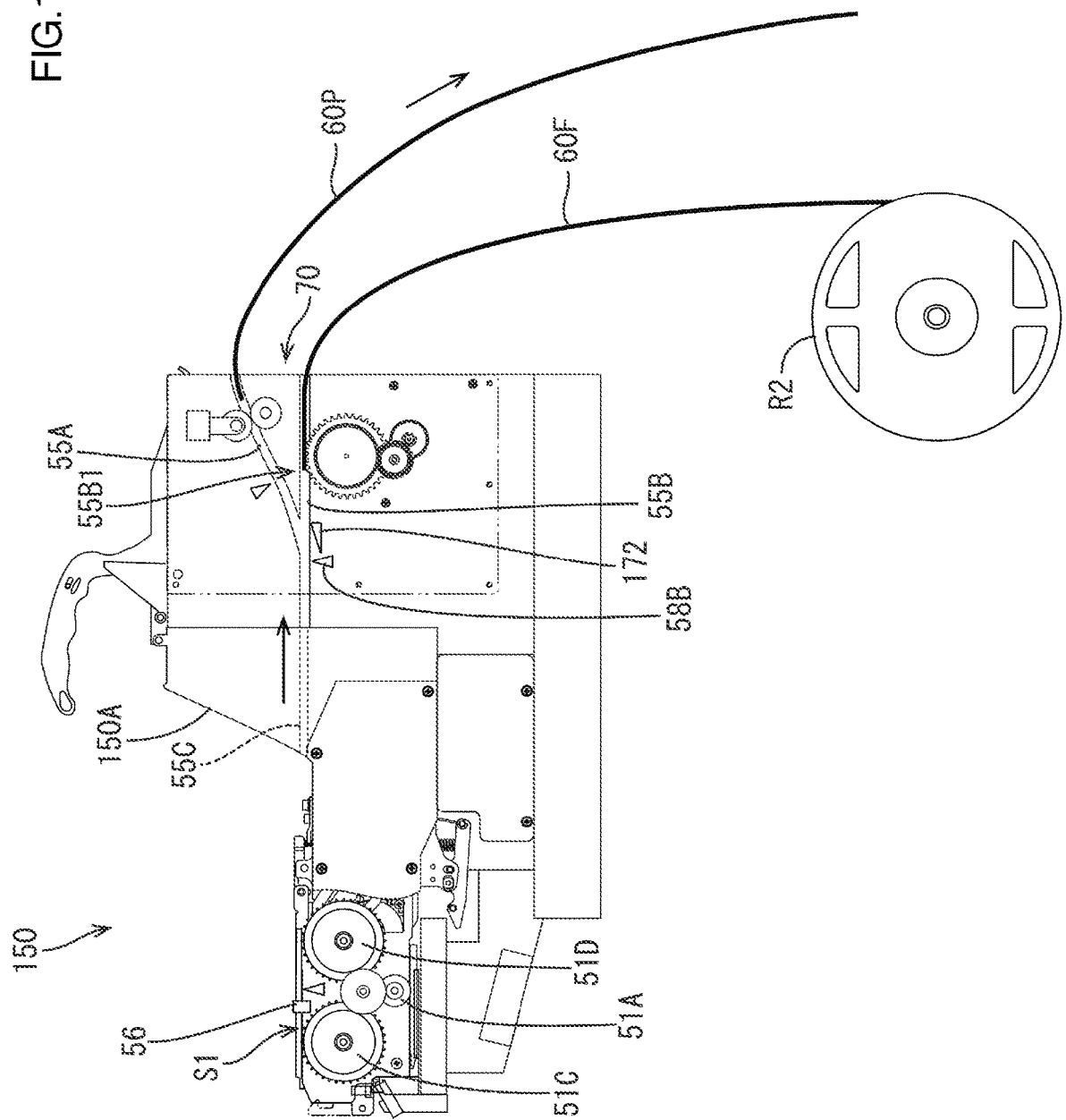
FIG. 14 is a side view illustrating a step (2) of the discharging method according to the second embodiment.

Next, the previous component supply tape 60P is urged by the urging motor 53A and the urging motor 53A is driven and rotated. Accordingly, as illustrated in FIG. 13, the previous component supply tape 60P is transferred further rearward by the urging motor 53A and the rear end portion of the previous component supply tape 60P is discharged outside the feeder 150. The front end portion of the previous component supply tape 60P is transferred further rearward by the urging motor 53A and the whole previous component supply tape 60P is discharged outside the feeder 150 as illustrated in FIG. 14. In this embodiment, the discharge process is performed according to the above sequence.

In this embodiment, the guide member 172 is moved down (see FIG. 14) after the previous component supply tape 60P is discharged outside the feeder 150 and the urging motor 53A is stopped. Accordingly, if the transfer process is performed subsequently to the discharge process, the front end portion of the subsequent component supply tape 60F that is to be transferred frontward does not hit the guide member 172 and the subsequent component supply tape 60F is transferred toward the component pick-up position S1.

(Discharge Process)

Figure 15:
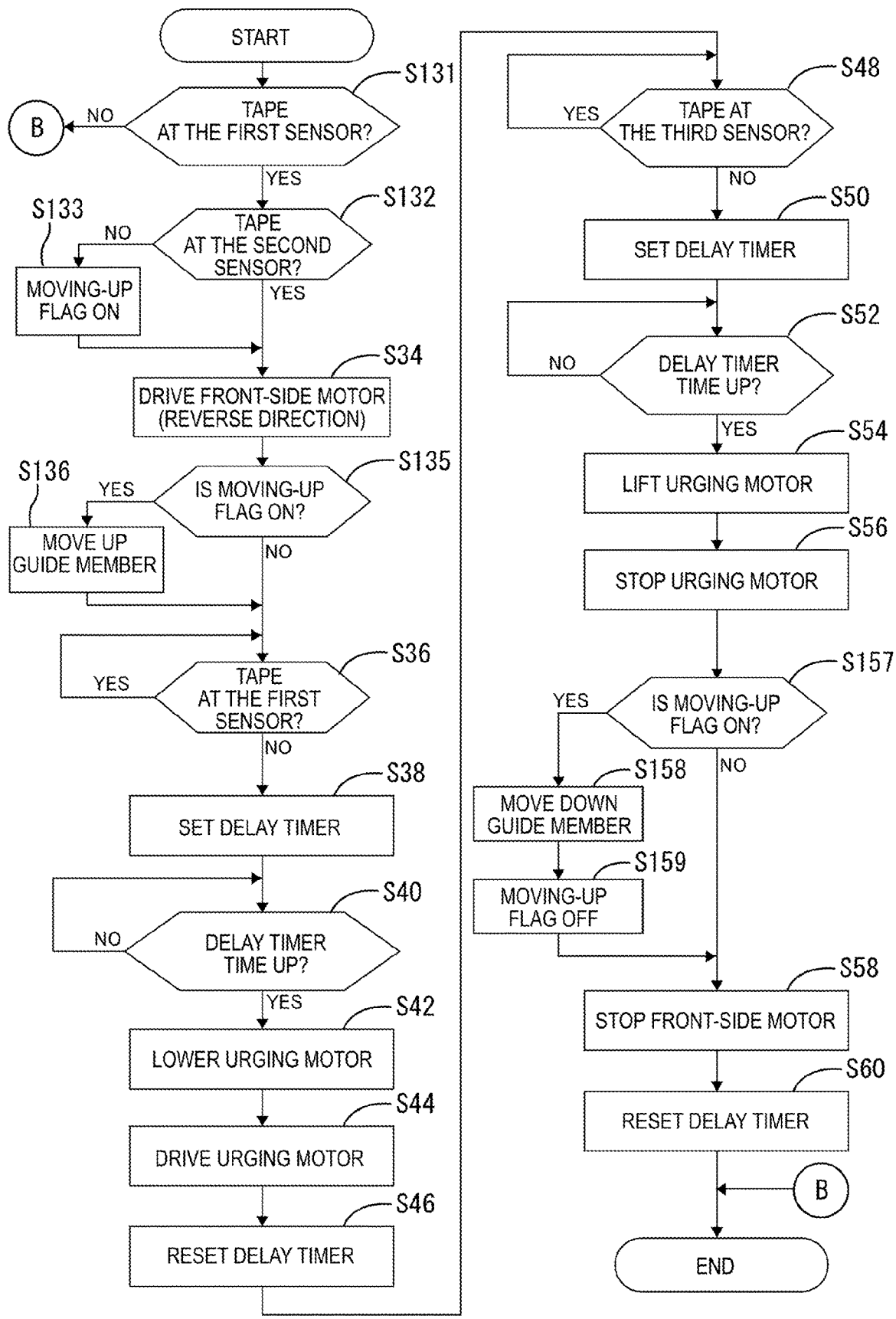
FIG. 15 is a flowchart illustrating a flow of a discharge process according to the second embodiment.
Figure 16:
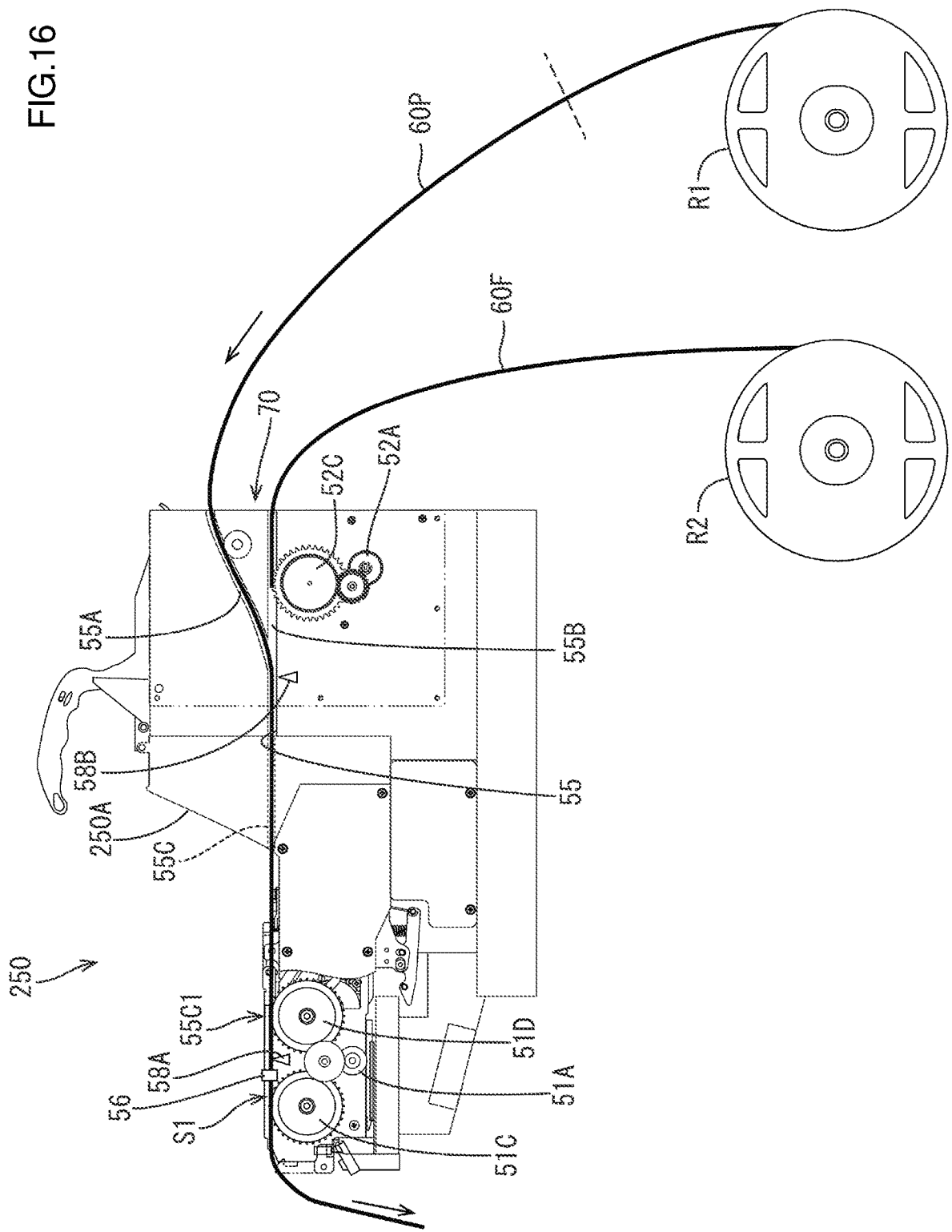
FIG. 16 is a side view schematically illustrating a feeder according to a third embodiment.

Next, the discharge process that is performed by the discharge processing portion 87A of the control portion 80 according to the second embodiment will be described with reference to a flowchart illustrated in FIG. 15. In the discharge process, the discharge processing portion 87A detects whether the component supply tape 60 is at the first sensor 58A in the body portion 150A of the feeder 150 or not (S131).

If the discharge processing portion 87A detects that the component supply tape 60 is at the first sensor 58A in S131 (S131:YES), the process proceeds to S132. If the discharge processing portion 87A detects that no component supply tape 60 is at the first sensor 58A in S131 (S131:NO), the discharge process is terminated.

The discharge processing portion 87A detects whether the component supply tape 60 is at the second sensor 58B or not in S132. If the discharge processing portion 87A detects that the component supply tape 60 is at the second sensor 58B in S132 (S132:YES), the process proceeds to S34. If the discharge processing portion 87A detects that no component supply tape 60 is at the second sensor 58B in S132 (S132: NO), it is assumed that the rear end portion 60P2 of the previous component supply tape 60P is on the common tape path 55C and the moving-up flag is set to ON (S133) and the process proceeds to S34.

The discharge processing portion 87A drives and rotates the front-side motor 51A in a reverse direction similarly to the first embodiment in S34 and the process proceeds to S135. The discharge processing portion 87A determines whether the moving-up flag is on in S135. If determining that the moving-up flag is ON in S135 (S135:YES), the discharge processing portion 87A moves up the guide member 172 and the process proceeds to S36. Accordingly, the previous component supply tape 60P is guided by the guide member 172 to the first tape path 55A. If the discharge process portion 87A determines that the moving-up flag is not ON in S135 (S135:NO), the process proceeds to S36.

In S36, the discharge processing portion 87A performs the processes from S36 to S56 similarly to the first embodiment. After the discharge processing portion 87A finishes the processes of S56, the process proceeds to S157.

In S157, the discharge processing portion 87A determines whether the moving-up flag is ON. If determining that the moving-up flag is ON in S157 (S157:YES), the discharge processing portion 87A moves down the guide member 172 (S158) and sets the moving-up flag to OFF. Then, the process proceeds to S56. Accordingly, if the transfer process is performed subsequently to the discharge process, the front end portion of the subsequent component supply tape 60F that is to be transferred frontward does not hit the guide member 172. If the discharge processing portion 87A determines that the moving-up flag is not ON in S157 (S157:NO), the process proceeds to S56.

In S56, the discharge processing portion 87A performs the processes of S56 and S58 similarly to the first embodiment and the discharge process is terminated.

(Effects of Second Embodiment)

As described before, in the feeder-type supplying device of this embodiment, the guide member 172 is moved up (in the first state), when the discharge process is performed. Even if the rear end portion 60P2 of the previous component supply tape 60P is on the common tape path 55C, the rear end portion 60P2 of the previous component supply tape 60P that is transferred rearward in the discharge process is guided to the first tape path 55A by the path that connects the common tape path 55C and the first tape path 55A via the sloped surface of the guide member 172.

If the discharge process is finished, the guide member 172 is moved down (in the second state) and does not block the connection point of the second tape path 55B and the common tape path 55C. Therefore, the subsequent component supply tape 60F that is previously engaged with the third sprocket 52C can be smoothly transferred toward the component pick-up position S1 in the transfer process after the discharge process is finished. Accordingly, in this embodiment, even if the rear end portion 60P2 of the previous component supply tape 60P is on the common tape path 55C, the component replacement operation can be automated and a time for the component replacement operation can be shortened.

Third Embodiment

A third embodiment will be described with reference to FIGS. 16 to 20. A feeder-type supplying device according to the third embodiment includes a feeder 250 that has a configuration of the feeder 50 of the first embodiment excluding the discharge portion 53 and the third sensor 58C. Other configurations of the feeder-type supply device and the configuration of the surface mounting device are same as those of the first embodiment and will not be described.

In this embodiment, a control portion 280 includes a computing processing portion 281 and the computing processing portion 281 includes the delay timer 81A to which a certain time is previously set. The certain time previously set to the delay timer 81A is a time period required for the rear end portion of the component supply tape 60 that is transferred frontward on the tape path 55 to pass the position to be engaged with the first sprocket 51C after moving away from the positon of the common tape path 55C where the first sensor 58A is disposed.

Figure 17:
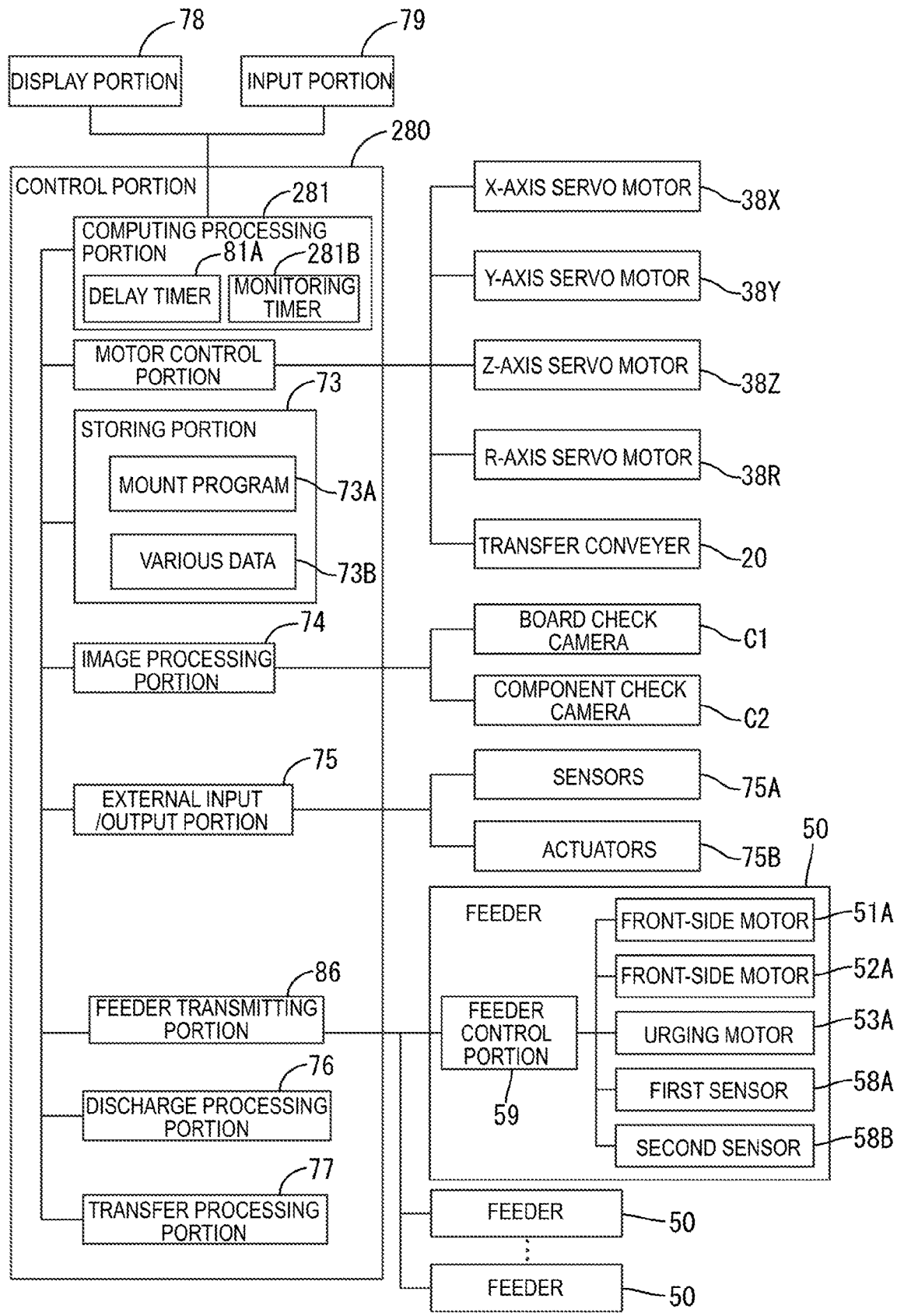
FIG. 17 is a block diagram illustrating an electric configuration of a surface mounting device according to the third embodiment.

In this embodiment, as illustrated in FIG. 17, the computing processing portion 281 of the control portion 280 includes a monitoring timer 281B to which a predefined time is set. Even though the discharge process for the previous component supply tape 60P is being performed, the sensors 58A, 58B in the body portion 250A may detect the component supply tape 60. In such a case, an error may be caused in the component supply tape 60, the control portion 280, or the feeder 250. The monitoring timer 281B is used to stop the discharge process when the predefined time has passed.

(Discharging Method)

A discharging method in the discharge process performed in the feeder-type supplying device according to the third embodiment will be described. The above described configurations that are common to each of the first embodiment and the second embodiment will not be described. The third embodiment includes a cutting process in which the previous component supply tape 60P is previously cut at a rear side with respect to the feeder 250 with keeping a length of the previous component supply tape 60P required for supplying the electronic components E1 before changing the model while the electronic components E1 are supplied from the previous component supply tape 60P (refer a dashed line on an upper side with respect to the reel R1 in FIG. 16).

Figure 18:
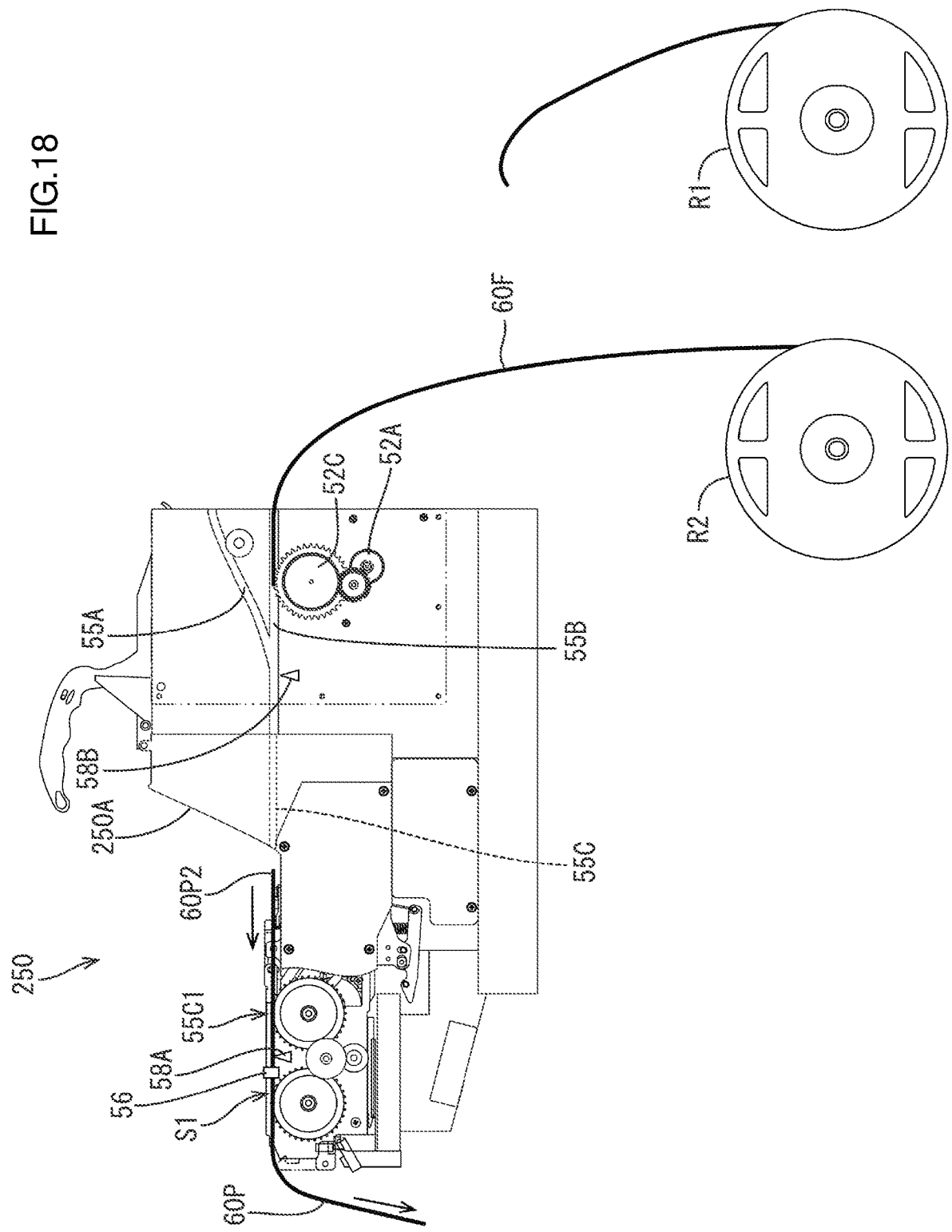
FIG. 18 is a side view illustrating a step (1) of a discharging method according to the third embodiment.

In the discharge process of this embodiment, unlike the first embodiment and the second embodiment, the previous component supply tape 60F is forcedly discharged frontward. Namely, in the discharge process, the front-side motor 51A is driven and rotated in the forward direction such that the first sprocket 51C and the second sprocket 51D are rotated in a counterclockwise direction in FIG. 16. Accordingly, the previous component supply tape 60P is transferred frontward and the cut rear end portion 60P2 of the previous component supply tape 60P reaches the common tape path 55C, as illustrated in FIG. 18.

Figure 19:
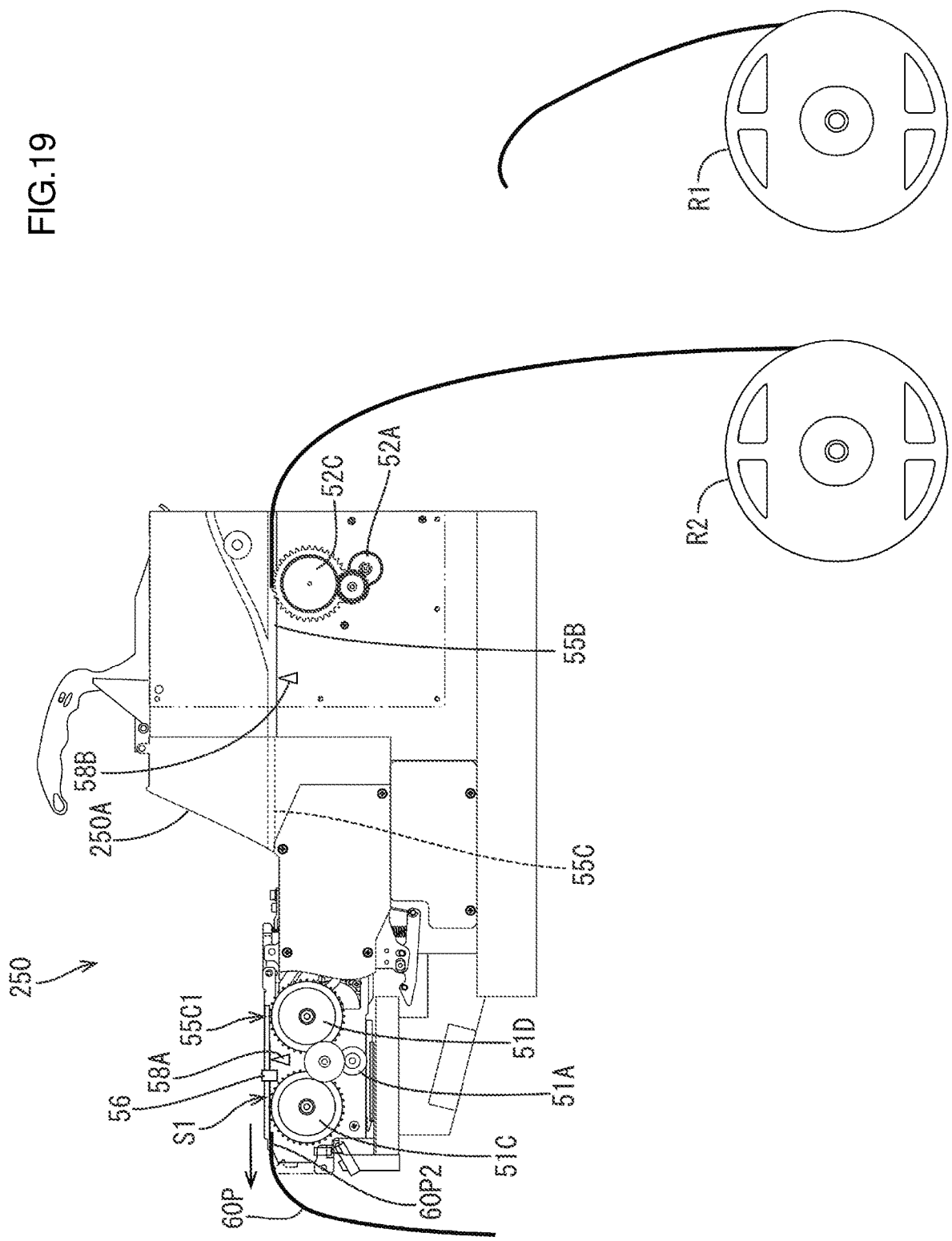
FIG. 19 is a side view illustrating a step (2) of the discharging method according to the third embodiment.

If the previous component supply tape 60P is further transferred forward, as illustrated in FIG. 19, the cut rear end portion 60P2 of the previous component supply tape 60P is released from the first sprocket 51C and the previous component supply tape 60P is discharged outside the feeder 250 from the front portion of the feeder 250 due to the weight thereof. In the discharge process of this embodiment, the previous component supply tape 60P is transferred forward at a speed faster than the speed at which the component supply tape is transferred for supplying the electronic components E1. In this embodiment, the discharge process is performed with the above sequences.

In the discharge process of this embodiment, the previous component supply tape 60P that is discharged frontward passes the uncovered portion 56 and is discharged outside the feeder 250. The previous component supply tape 60P that is to be discharged in the discharge process may include the electronic components E1 thereon. The top tape 64 is cut at the uncovered portion 56 and the electronic components E1 arranged on the previous component supply tape 60 are exposed. However, the exposed electronic components E1 are not picked up at the component pick-up positon S1. Therefore, in the discharge process of this embodiment, the previous component supply tape 60P is discharged outside the feeder 250 while holding the electronic components E1 thereon.

(Discharge Process)

Figure 20:
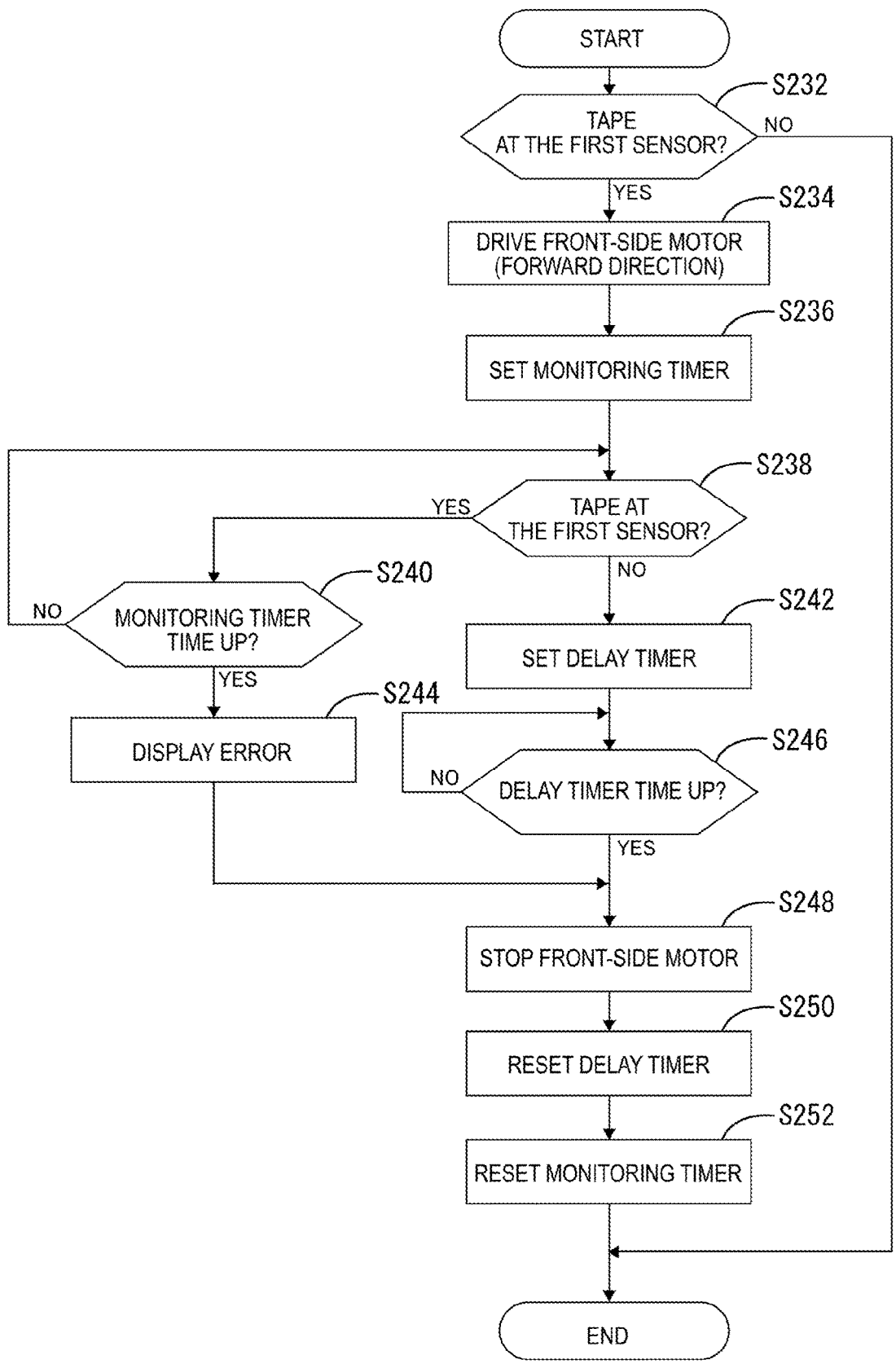
FIG. 20 is a flowchart illustrating a flow of a discharge process according to the third embodiment.

The discharge process performed by the discharge processing portion 87A of the control portion 280 according to the second embodiment will be described with reference to a flowchart illustrated in FIG. 20. In the discharge process, the discharge processing portion 87A detects whether the component supply tape 60 is at the first sensor 58A in the body portion 250A of the feeder 250 or not (S232).

If the discharge processing portion 87A detects that the component supply tape 60 is at the first sensor 58A in S232 (S232:YES), the process proceeds to S234. If the discharge processing portion 87A detects that no component supply tape 60 is at the first sensor 58A in S232 (S232:NO), the discharge process is terminated.

The discharge processing portion 87A drives and rotates the front-side motor 51A in the forward direction in S234 and the process proceeds to S236. Accordingly, the previous component supply tape 60P disposed at the first transfer position 55C1 is transferred frontward.

The discharge processing portion 87A sets the monitoring timer 281B included in the computing processing portion 281 (the monitoring timer 281B starts counting) in S236 and the process proceeds to S238. The discharge processing portion 87A determines whether the first sensor 58A detects the component supply tape 60 in S238.

If the discharge processing portion 87A detects that the component supply tape 60 is at the first sensor 58A in S238 (S238:YES), the process proceeds to S250. If the discharge processing portion 87A detects that no component supply tape 60 is at the first sensor 58A in S238 (S238:NO), the process proceeds to S242.

The discharge processing portion 87A determines whether the predetermined time period is up in the monitoring timer 281B (whether a counter of the monitoring timer 281B is zero) in S240. If determining that time is up in the monitoring timer 281B in S240 (S240:YES), the discharge processing portion 87A assumes that any error in that, for example, the previous component supply tape 60 P is not previously cut may be caused and an error is displayed on the display portion 78 (S244) and the process proceeds to S248. If the discharge processing portion 87A determines that the time is not up in the monitoring timer 281B in S249 (S249:NO), the process returned to S238.

The discharge processing portion 87A sets the delay timer 81A (the delay timer 81A starts counting) in S242 and proceeds to S40. The discharge processing portion 87A determines whether time is up in the delay timer 81A (whether a counter of the delay timer 81A is zero) in S246.

If determining that time is up in the delay timer 81A in S246 (S246:YES), the discharge processing portion 87A assumes that the rear end portion of the previous component supply tape 60P that is being transferred forward passes the position to be engaged with the first sprocket 51C (is released from the first sprocket 51C) and proceeds to S248. If determining that the time is not up in the delay timer 81A in S246 (S246:NO), the discharge processing portion 87A performs the process of S246 repeatedly until the time is up in the delay timer 81A.

The discharge processing portion 87A stops driving of the front-side motor 51A. Next, the discharge processing portion 87A resets the delay timer 81A (S250). Next, the discharge processing portion 87A resets the monitoring timer 281B (S252) and the discharge process is terminated.

(Effects of Third Embodiment)

As described before, in the feeder-type supplying device according to this embodiment, the previous component supply tape 60P is previously cut at a rear side with respect to the feeder 250 while keeping a length of the previous component supply tape 60P required for supplying the electronic components E1. Therefore, in the discharge process, the previous component supply tape 60P is transferred forward to be discharged outside the feeder 250. Accordingly, the previous component supply tape 60P can be automatically discharged outside the feeder 250 in the discharge process without disposing the discharge portion 53, which are described in the first embodiment and the second embodiment, on the rear side with respect to the feeder 260 and on the first tape path 55A. As a result, the component replacement operation can be automated with a simple configuration and time required for the component replacement operation is shortened.

In the discharge process of this embodiment, the first sensor 58A detects that there is no component supply tape 60P at the position on the common tape path 55C frontward than the component pick-up position S1, and it is assumed that the previous component supply tape 60P that is being transferred frontward is discharged outside the feeder 250 from the front side with respect to the feeder 250 according to the time up of the delay timer 81A. Then, the rotation of the front-side motor 51A is stopped. Therefore, the front-side motor 51A is less likely to be driven and rotated unnecessarily.

The previous component supply tape 60P may continue to be transferred frontward of the feeder 250 in the discharge process even though an error such that the component supply tape 60P is not previously cut is caused. This embodiment includes the monitoring timer 281B and if the first sensor 58A detects the component supply tape 60P even after the predetermined time that is set to the monitoring timer 281B has passed, any error may be caused and an error is displayed on the display screen of the display portion. Therefore, the front-side motor 51A is less likely to be driven and rotated unnecessarily.

<Fourth Embodiment>

A fourth embodiment will be described with reference to FIGS. 21 to 24. A feeder-type supplying device according to the fourth embodiment includes a feeder 350 that has a configuration that differs from that of the first embodiment in a rear portion of the feeder 350. The configuration of the front portion of the feeder 350, other configurations in the feeder-type supplying device, and the configuration of the surface mounting device are same as those of the first embodiment and will not be described.

Figure 21:
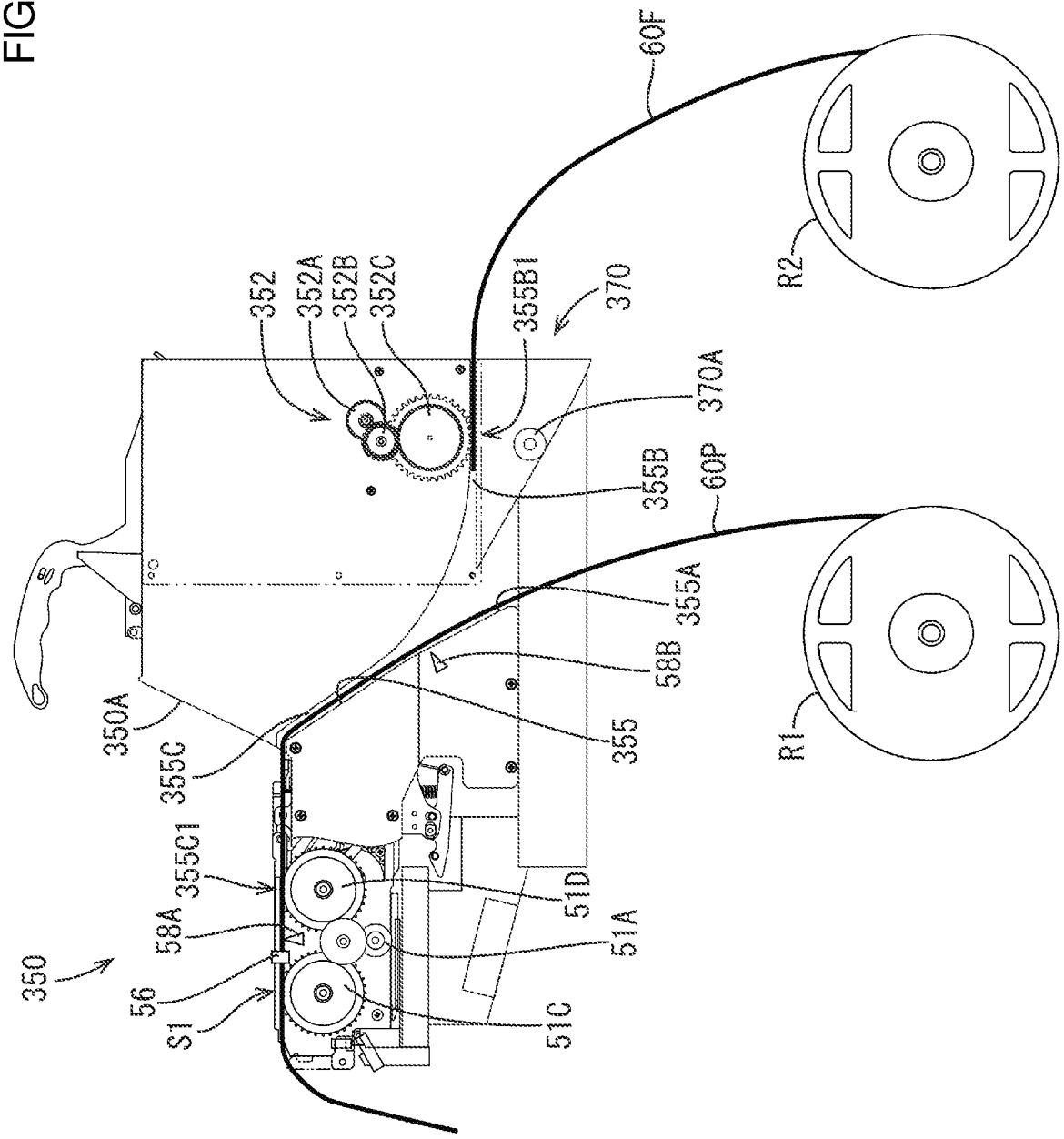
FIG. 21 is a side view schematically illustrating a feeder according to a fourth embodiment.

As illustrated in FIG. 21, in a body portion 350A of the feeder 350 according to this embodiment, the first tape path 355A extends continuously from the common tape path 355C and is sloped downwardly from the front side toward the rear side. The first tape path 355A is open downward in the body portion 350A. The first tape path 355A is sloped such that the component supply tape 60 drops downward by its own weight after the component supply tape 60 is transferred rearward and a distal end portion of the component supply tape 60 is released from the second sprocket 51D. A distance between the second sprocket MD and the slope is short such that the component supply tape 60 that is released from the second sprocket 51D easily drops.

As illustrated in FIG. 21, the second sensor 58B is arranged in the body portion 350A to face the slope of the first tape path 355A. In this embodiment, the third sensor is not provided in the body portion 350A. The third sprocket 352C of the rear-side transfer portion 352 is arranged in the body portion 350A such that a part of teeth of the third sprocket 352C is exposed (uncovered) on a lower side thereof.

As illustrated in FIG. 21, in the rear end portion of the body portion 350A, a rear-side motor 352A, a rear-side driven gear 352B, and a third sprocket 352C that are included in a rear-side transfer portion 352 are arranged in an opposite order from those of the feeder 50 of the first embodiment. A transferring unit 370 is mounted in the rear end portion of the body portion 350A with having a clearance from the slope of the first tape path 355A. The transferring unit 370 has a horizontal upper surface that is opposite the exposed (uncovered) teeth of the third sprocket 352C with having a clearance through which the component supply tape 60 can be transferred. The clearance is a second passage 355B.

(Discharging Method)

Next, a discharging method in the discharge process in the feeder-type supplying device according to the fourth embodiment will be described. The assumption that is common to each of the first and second embodiments will not be described in this embodiment. In this embodiment, as illustrated in FIG. 21, the reel R1 around which the previous component supply tape 60P is wound is arranged below the opened portion of the first tape path 355A. Therefore, the previous component supply tape 60P can reach the common tape path 355C through the first tape path 355A.

Figure 22:
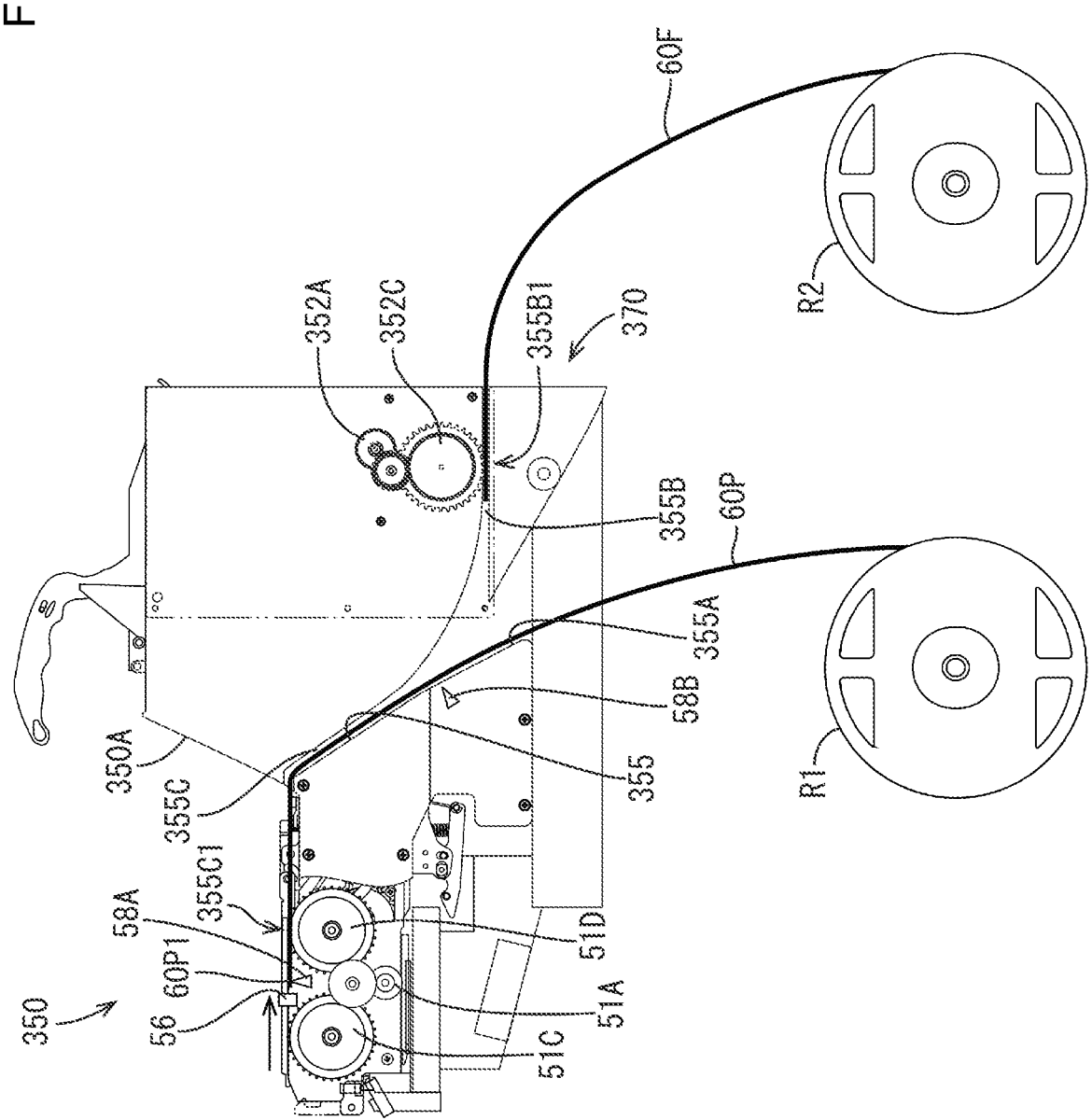
FIG. 22 is a side view illustrating a step (1) of a discharging method according to the fourth embodiment.
Figure 23:
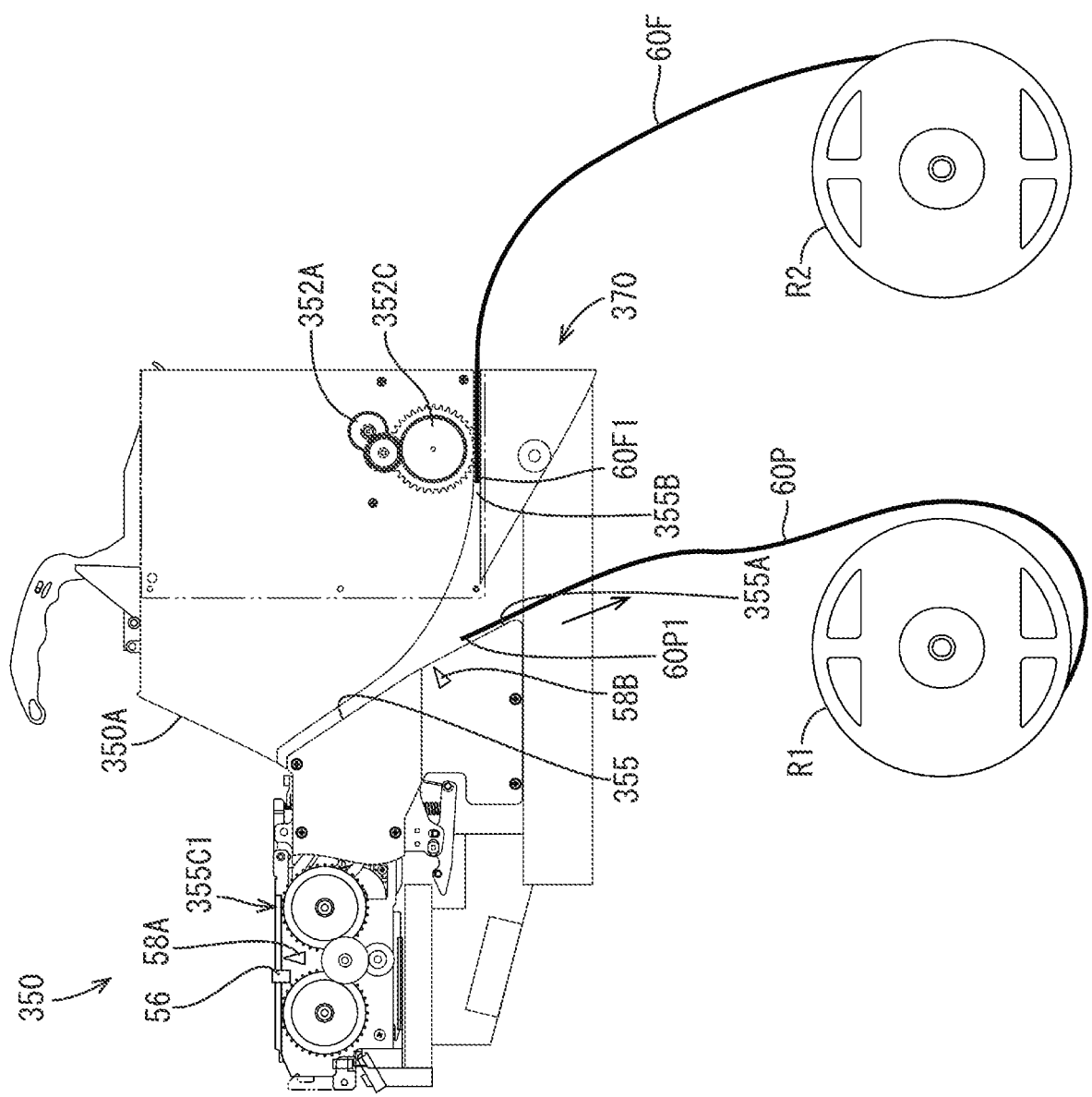
FIG. 23 is a side view illustrating a step (2) of the discharging method according to the fourth embodiment.

In the discharge process, the front-side motor 52A is driven and rotated in a reverse direction in the state illustrated in FIG. 21. Accordingly, the previous component supply tape 60P is transferred rearward as illustrated in FIG. 22. If the distal end portion 60P1 of the previous component supply tape 60P is released from the second sprocket 51D at the first transfer position 355C1, the previous component supply tape 60P drops by its weight along the slope of the first tape path 355A. Then, the previous component supply tape 60P is discharged from the open portion of the first tape path 355A toward a lower side of the feeder 350. In this embodiment, the discharge process is performed according to the above sequence.

In this embodiment, if the transfer process is performed subsequently to the discharge process, a front end portion 60F1 of the subsequent component supply tape 60F that is transferred frontward passes the open portion of the first tape path 355A on an upper side thereof and reaches the slope of the first tape passage 355A. The subsequent component supply tape 60F is transferred further frontward and moves upward along the slope of the first tape path 355A and reaches the first transfer position 355C1.

(Discharge Process)

Figure 24:
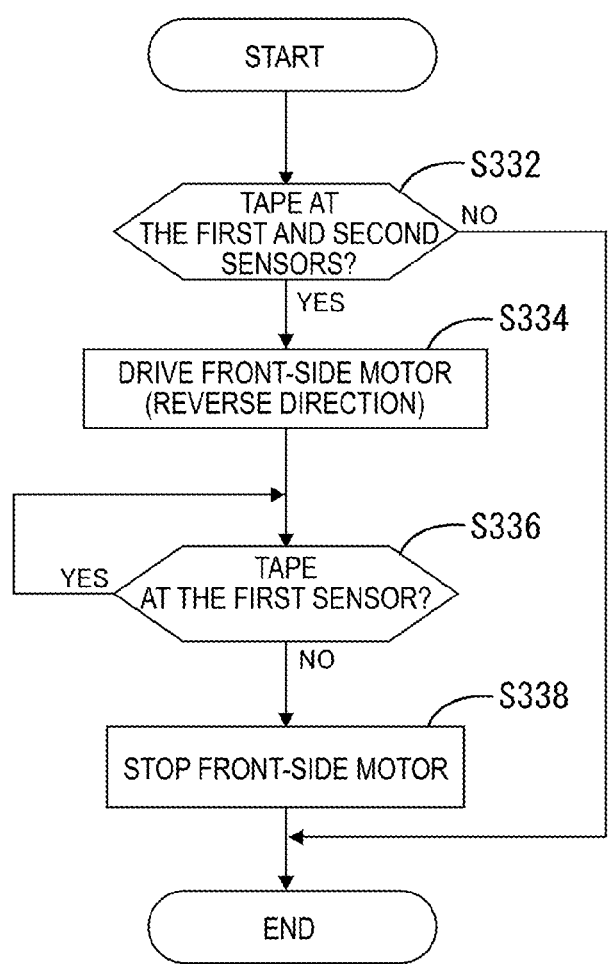
FIG. 24 is a flowchart illustrating a flow of a discharge process according to the fourth embodiment.

Next, a discharge process performed by the discharge processing portion 87A of the control portion 80 according to the fourth embodiment will be described with reference to a flowchart illustrated in FIG. 24. In the discharge process, the discharge process portion 87A first detects whether the component supply tape 60 is at the first sensor 58A and the second sensor 58B in the body portion 350A of the feeder 350 (S332).

If the discharge processing portion 87A detects that the component supply tape 60 is at both of the first sensor 58A and the second sensor 58B in S332 (S332:YES), the process proceeds to S334. If the discharge processing portion 87A detects that no component supply tape 60 is at at least one of the first sensor 58A and the second sensor 58B in S332 (S332:NO), the discharge process is terminated.

The discharge processing portion 87A drives and rotates the front-side motor 51A in a reverse direction and proceeds to S336. Accordingly, the previous component supply tape 60P that is at the first transfer position 55C1 is transferred rearward. The discharge processing portion 87A detects whether the component supply tape 60 is at the first sensor 58A in S336.

If the discharge processing portion 87A detects that the component supply tape 60 is at the first sensor 58A in S336 (S336:YES), the process of S336 is repeatedly performed. If the discharge processing portion 87A detects that no component supply tape 60 is at the first sensor 58A in S336 (S336:NO), it is assumed that the distal end portion of the previous component supply tape 60P is released from the second sprocket 51D and the previous component supply tape 60P drops along the slope of the first tape path 355A. Then, the discharge processing portion 87A stops driving of the front-side motor 51A and the discharge process is terminated.

(Effects of Fourth Embodiment)

As described before, in the feeder-type supplying device according to this embodiment, in the discharge process, the previous component supply tape 60P is transferred rearward such that the previous component supply tape 60P drops along the slope of the first tape path 355A by its own weight and the whole of the previous component supply tape 60P can be discharged outside the feeder 350. Thus, the previous component supply tape 60P can be automatically discharged outside the feeder 350 in the discharge process without providing another mechanism such as the discharge portion 53 for transferring the previous component supply tape 60P rearward on the first tape path 355A. As a result, the component replacement operation can be automated with a simple configuration and time required for the component replacement operation is shortened.

Fifth Embodiment

Figure 25:
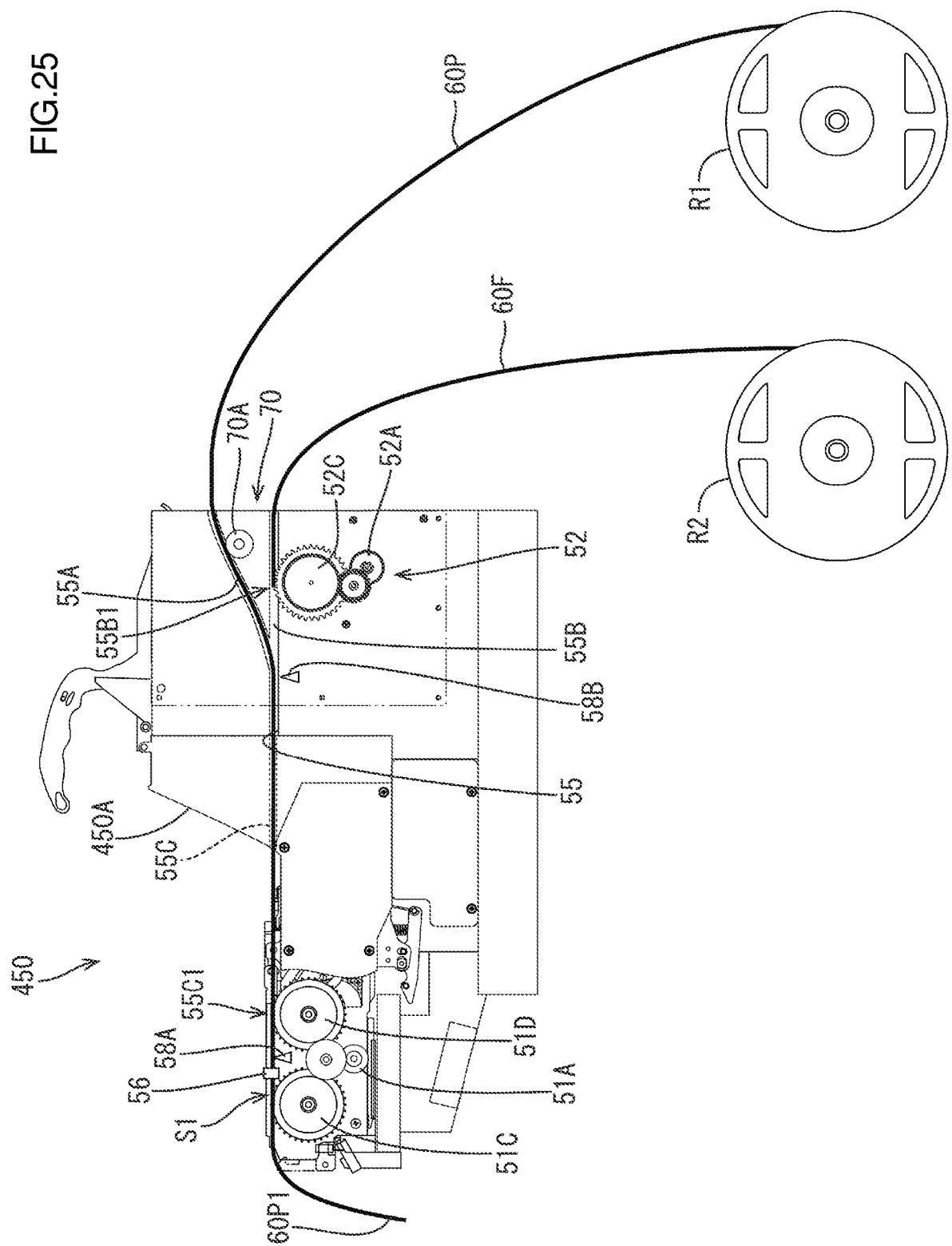
FIG. 25 is a side view schematically illustrating a feeder according to a fifth embodiment.

A fifth embodiment will be described with reference to FIGS. 25 to 28. A feeder-type supplying device according to the fifth embodiment includes a feeder 450 that has a configuration of the feeder 50 of the first embodiment excluding the discharge portion 53 and the third sensor 58C, as illustrated in FIG. 25. Other configurations of the feeder-type supply device and the configuration of the surface mounting device are same as those of the first embodiment and will not be described.

(Discharging Method)

Next, a discharging method in the discharge process of the feeder-type supplying device according to the fifth embodiment will be described. The assumption that is common to each of the first and second embodiments will not be described in this embodiment.

Figure 26:
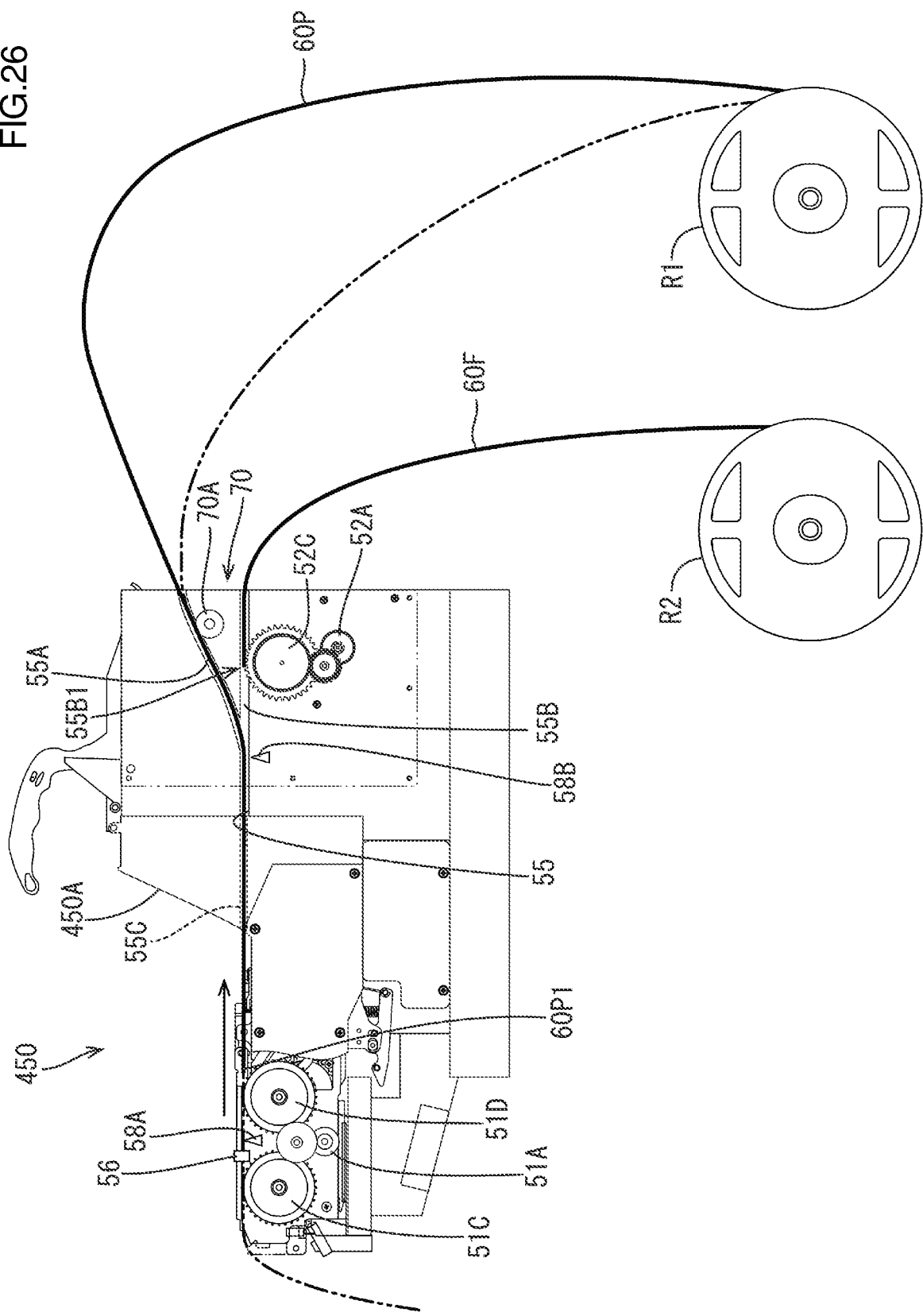
FIG. 26 is a side view illustrating a step (1) of a discharging method according to the fifth embodiment.

In the discharge process, the front-side motor 51A is driven and rotated in a reverse direction. Accordingly, the previous component supply tape 60P is transferred rearward. In this embodiment, the previous component supply tape 60P that is transferred rearward from the rear end portion of the body portion 50A is not wound around the reel R1. Therefore, if the previous component supply tape 60P is transferred rearward and the distal end portion 60P1 of the previous component supply tape 60P is released from the second sprocket 51D, a part of the previous component supply tape 60P is loosened rearward on the rear side with respect to the body portion 450A of the feeder 450, as illustrated in FIG. 26 (a two dot-chain line on the rear side of the feeder 450 in FIG. 26 illustrates a position of the previous component supply tape 60P before being loosened rearward).

Figure 27:
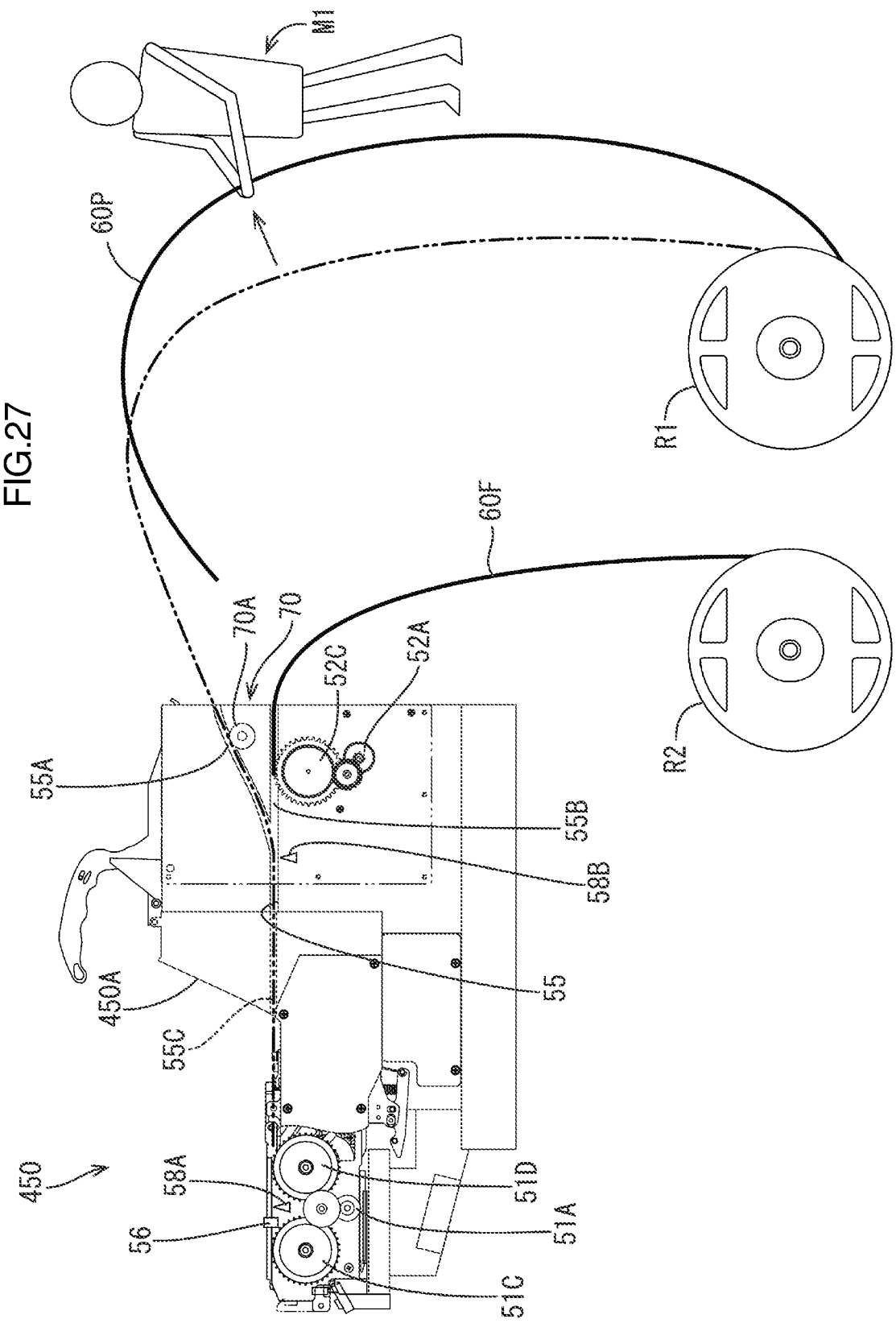
FIG. 27 is a side view illustrating a step (2) of the discharging method according to the fifth embodiment.

Next, as illustrated in FIG. 27, the rearward loosened portion of the previous component supply tape 60P is held by an operator M1 on a rear side of the feeder 450 and pulled rearward (a two dot-chain line in FIG. 27 illustrates a position of the previous component supply tape 60P before being pulled rearward). Accordingly, the whole of the previous component supply tape 60P can be discharged outside the feeder 450 by the operator M1. In this embodiment, the discharge process is performed according to the above sequence.

(Discharge Process)

Figure 28:
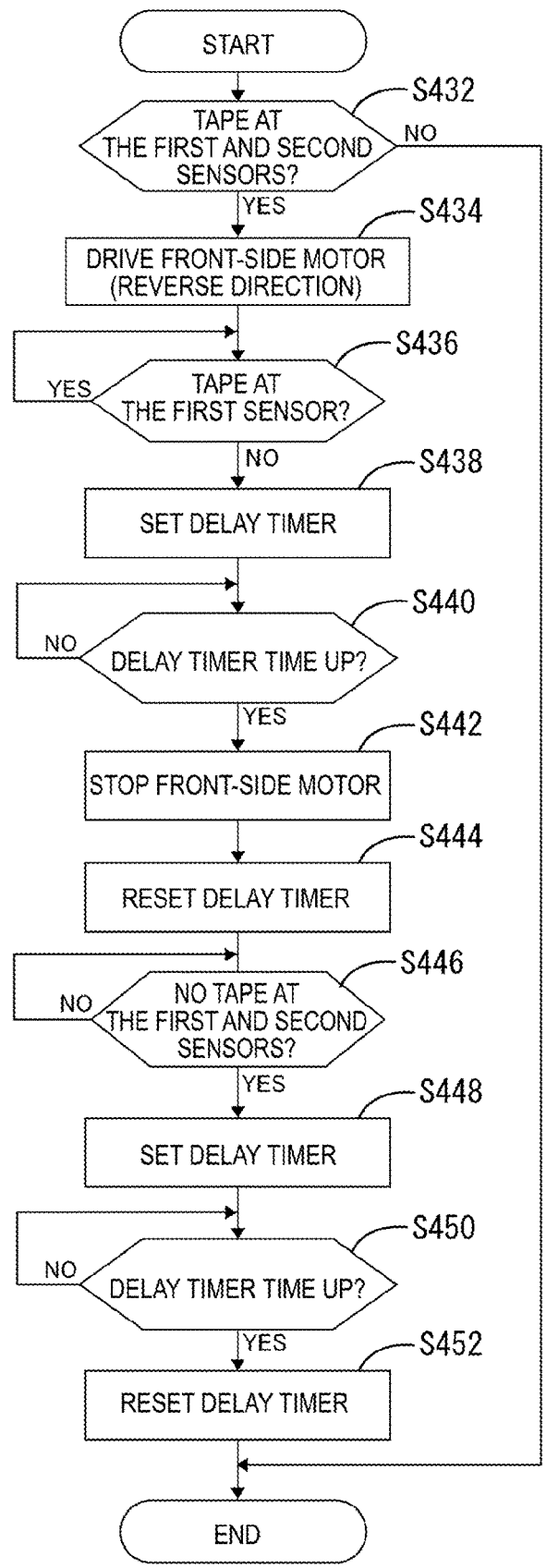
FIG. 28 is a flowchart illustrating a flow of a discharge process according to the fifth embodiment.

Next, the discharge process performed by the discharge processing portion 87A of the control portion 80 according to the fifth embodiment will be described with reference to a flowchart illustrated in FIG. 28. In the discharge process, the discharge processing portion 87A first detects whether the component supply tape 60 is at the first sensor 58A and the second sensor 58B in the body portion 450A of the feeder 450 (S432).

If the discharge processing portion 87A detects that the component supply tape 60 is at both of the first sensor 58A and the second sensor 58B (S432:YES), the process proceeds to S434. If the discharge processing portion 87A detects that no component supply tape 60 is at at least one of the first sensor 58A and the second sensor 58B (S432:NO), the discharge process is terminated.

The discharge processing portion 87A drives and rotates the front-side motor 51A in a reverse direction in S434 and proceeds to S436. Accordingly, the previous component supply tape 60P that is at the first transfer position 55C1 is transferred rearward. The discharge processing portion 87A detects whether the component supply tape 60 is at the first sensor 58A in S436.

If the discharge processing portion 87A detects that the component supply tape 60 is at the first sensor 58A in S436 (S436:YES), the process of S436 is performed repeatedly. If the discharge processing portion 87A detects that no component supply tape 60 is at the first sensor 58A in S436 (S436:NO), the delay timer 81A is set (the delay timer 81A starts counting) and proceeds to S440. The discharge processing portion 87A determines whether time is up in the delay timer 81A (whether a counter of the delay timer 81A is zero) in S440.

If determining that time is up in the delay timer 81A in S440 (S440:YES), the discharge processing portion 87A assumes that the front end portion of the previous component supply tape 60P that is being transferred rearward passes the first transfer position 55C1 (is released from the second sprocket 51D) and a part of the previous component supply tape 60P is loosened rearward on the rear side of the body portion 450A of the feeder 450 and proceeds to S442. If determining that the time is not up in the delay timer 81A in S440 (S40:NO), the discharge processing portion 87A performs the process of S440 repeatedly until the time is up in the delay timer 81A.

The discharge processing portion 87A stops driving of the front-side motor 51A in S442. Next, the discharge processing portion 87A resets the delay timer (S444) and proceeds to S446. The discharge processing portion detects whether the component supply tape 60 is at the first sensor 58A and the second sensor 58B in S446 (S446).

If the discharge processing portion 87A detects that no component supply tape 60 is at both of the first sensor 58A and the second sensor 58B (S446:YES), it is assumed that the component supply tape 60 is pulled or being pulled rearward by an operator M1 and the process proceeds to S448. If the discharge processing portion 87A detects that the component supply tape 60 is at at least one of the first sensor 58A and the second sensor 58B in S446 (S446:NO), the process of S446 is repeatedly performed.

The discharge processing portion 87A sets the delay timer 81A (the delay timer 81A starts to count) again in S448 and proceeds to S450. The discharge processing portion 87A determines whether time is up in the delay timer 81A (whether a counter of the delay timer 81A is zero) in S450.

If determining that time is up in the delay timer 81A in S450 (S450:YES), the discharge processing portion 87A assumes that the component supply tape 60 extending outside the body portion 450A from the rear side of the body portion 450A is pulled rearward by an operator M1 and discharged outside the feeder 450. Then, the delay timer is reset (S452) and the discharge process is terminated. If determining that the time is not up in the delay timer 81A in S450 (S450:NO), the discharge processing portion 87A performs the process of S450 repeatedly until the time is up in the delay timer 81A.

According to the determination by the discharge processing portion 87A that the time is up in the delay timer 81A in S450, the transfer processing portion 87B determines that the discharge process is terminated or the previous component supply tape 60P is pulled by the operator M1. Then, the transfer processing portion 87B performs the transfer process described in the first embodiment subsequently to the discharge process. Accordingly, the subsequent component supply tape 60F holding the electronic components E1 after model changing is transferred to the component pick-up position S1.

(Effects of Fifth Embodiment)

As described before, in the feeder-type supplying device according to this embodiment, since the previous component supply tape 60P is pulled by the operator M1 in the discharge process, the discharge process can be completed without requiring control by the control portion 80 to discharge a whole of the previous component supply tape 60P from the feeder 450. Therefore, the control by the control portion 80 is simplified and the configuration of the feeder-type supplying device is simplified.

In this embodiment, after the discharge process is performed, a part of the previous component supply tape 60P is loosened rearward on the rear side of the body portion 450A of the feeder 450 so that the operator M1 easily finds a specific feeder 450 where the discharge process has been performed among the feeders 450 amounted in the feeder-type supplying devices. Therefore, the previous component supply tapes 60P are successively and quickly pulled from the respective specific feeders 450. Even with such a configuration that a part of discharge operation of the previous component supply tape 60P is performed with the operator' hand, the replacement of the component supply tape 60 in the component replacement process is easily and quickly performed and the time required for the component replacement is shortened compared to the prior art configurations.

Sixth Embodiment

A Sixth embodiment will be described. In a feeder-type supplying device according to the sixth embodiment, the control portion performs only the discharge process if the model changing button of the input portion is pressed. Other configurations of the feeder-type supply device and the configuration of the surface mounting device are same as those of the first embodiment. In this embodiment, if the model changing button is pressed by an operator, the control portion performs only the discharge process collectively for the feeders specified by the specifying data among the feeders, and the transfer process is not performed.

(Effects of Sixth Embodiment)

In the feeder-type supplying device of this embodiment, the control portion performs only the discharge process collectively for the feeders specified by the specifying data among the feeders. In the prior art, the discharge process is required to be performed for each of the specified feeders among the feeders. Compared to such a prior art configuration, even with the above configuration, the time required for the component replacement operation is shortened.

Other Embodiments

The present disclosure is not limited to the aspects explained in the above description made with reference to the drawings. The following aspects may be included in the technical scope of the present disclosure, for example.

(1) In each of the above embodiments, each feeder includes two sprockets in the front portion of the body portion thereof. However, each feeder may include one sprocket in the front portion of the body portion. In such a configuration, it is preferable that the uncovered portion is provided on a front side with respect to the front-side sprocket and the component pick-up position is provided on a front side with respect to the uncovered portion.

(2) In each of the above embodiments, the tape path including the first tape path, the second tape path, and the common tape path is provided in the body portion of each feeder. However, only one tape path extending in the front-rear direction may be provided in the body portion and the distal end portion of the subsequent component supply tape may be previously arranged on the same path as the previous component supply tape.

(3) In each of the above embodiments, the model changing button of the input portion is arranged outside the feeder-type component supplying device. However, the model changing button may be included in the feeder-type component supplying device or may be included in each feeder.

(4) In each of the above embodiments, the model changing process is performed if the model changing button is pressed by an operator. However, an instruction (a certain instruction) for performing the model changing process may be automatically input to the input portion from the control portion based on the mount program.

(5) In each of the above embodiments, a feeder is specified by the specifying data corresponding to the model changing of the printed boards according to the mount program. However, the method of specifying the feeder by the specifying data may not be limited. For example, the printed boards after model changing are input by an operator via the input portion and the feeder that is required to be replaced may be specified corresponding to the input printed boards.

(6) In the sixth embodiment, if the model changing button is pressed by an operator, the discharge process may be performed for all of the feeders mounted on the mounting member. In such a configuration, in addition to the model changing button for performing the discharge process for the feeder specified by the specifying data, the input portion may include an operation button for performing the discharge process collectively for all of the component supply tape arranged in all of the feeders.

(7) In each of the above embodiments, the control portion is included as a part of the configuration of the surface mounting device. However, a position of the control portion in the surface mounting device is not limited. For example, the control portion may be included as a part of the configuration of the feeder-type supplying device.

(8) In each of the above embodiments, the first tape path is separated from the second path by the transferring unit that is a separate member from the body portion. However, the first tape path may be separated from the second path by a part of the body portion.

The embodiments according to the present technology are described in detail. However, the above description is only examples and does not limit a scope of the claims. The technology described in the claims includes modifications and variations of the above described specific examples.

The invention claimed is:

1. A component supplying device configured to transfer a first component supply tape and a second component supply tape each including components thereon, the component supplying device comprising:

an input system configured to receive an instruction input from an outside of the component supply device;

a feeder comprising:
  a body including a first section in which a first transfer position and a component pick-up position are defined and a second section in which a second transfer position is defined, the first transfer position being between the component pick-up position and the second transfer position;
  a first transfer mechanism disposed in the first section; and
  a second transfer mechanism disposed in the second section; and a controller configured to:
  determine whether the first component supply tape is present at the first transfer position in response to the instruction input in the input system;
  if the first component supply tape is present at the first transfer position, control the first transfer mechanism to discharge at least a part of the first component supply tape including the components out of the feeder;
  when the control of the first transfer mechanism is completed, control the second transfer mechanism to transfer the second component supply tape from the second transfer position to the first transfer position; and
  when the control of the second transfer mechanism is completed, control the first transfer mechanism to transfer the second component supply tape to the component pick-up position.

2. The component supplying device according to claim 1, wherein
  the input system includes a button configured to be operated by an operator to input the instruction, and
  the controller is further configured to:
    determine whether the first component supply tape is present at the first transfer position regardless of conditions of the first component supply tape in the feeder after the controller receiving the instruction input from the input system.

3. The component supplying device according to claim 1, wherein
  the body further includes a tape cavity passing through the body at least in a direction in which the first component supply tape is transferred, the tape cavity is branched at a branch point in the second section and includes:
    a first cavity portion including a first opening in a first outer surface of the body at an end of the first section, the first cavity portion extending between the branch point and the first opening;
    a second cavity portion including a second opening in a second outer surface of the body at the second section, the second cavity portion extending between the branch point and the second opening; and
    a third cavity portion including a third opening in the second outer surface of the body at the second section, the third cavity portion extending between the branch point and a third opening, wherein
  the first transfer position and the component pick-up position are defined in the first cavity portion,
  the second transfer position is defined in the second cavity portion, and
  the body includes a through hole at the component pick-up position.

4. The component supplying device according to claim 3, wherein
  the feeder further includes a third transfer mechanism disposed in the second section,
  a third transfer position is defined in the third cavity portion, and
  the controller is further configured to:
    if the first component supply tape is present at the first transfer position, control the first transfer mechanism to transfer the first component supply tape to the third transfer position, in response to the instruction input in the input system; and
    when the control of the first transfer mechanism is completed, control the third transfer mechanism to discharge at least the part of the first component supply tape including the components at the third transfer position out of the feeder through the third opening.

5. The component supplying device according to claim 4, wherein
  the first transfer mechanism includes at least a first rotating member, the first transfer mechanism is disposed such that a part of the first rotating member is in the first cavity portion at the transfer position that is between the branch point and the component pick-up position, the part of the first rotating member is configured to contact with and urge one of the first component supply tape and the second component supply tape when the one of the first component supply tape and the second component supply tape is present at the first transfer position,
  the second transfer mechanism includes at least a second rotating member, the second transfer mechanism is disposed such that a part of the second rotating member is in the second cavity portion at the second transfer position that is between the branch point and the second opening, the part of the second rotating member is configured to contact with and urge the second component supply tape when the second component supply tape is present at the second transfer position, and
  the third transfer mechanism includes at least a third rotating member, the third transfer mechanism is disposed such that a part of the third rotating member is in the third cavity portion at the third transfer position that is between the branch point and the third opening, the part of the third rotating member configured to contact with and urge the first component supply tape when the one of the first component supply tape is present at the third transfer position.

6. The component supplying device according to claim 4, wherein
  the body further includes a path member disposed at the branch point to be movable between inside and outside of the second cavity portion, and
  the controller is further configured to:
    if the first component supply tape is present at the first transfer position, place the path member inside the second cavity portion to close the second cavity portion, in response to the instruction input in the input system prior to the control of the first transfer mechanism; and
    when the control of the first transfer mechanism is completed, move the path member to outside the second cavity portion to open the second cavity portion prior to the control of the second transfer mechanism.

7. The component supplying device according to claim 3, wherein
the third opening is at a bottom of the second section,
the third cavity portion is sloped downward from the branch point to the third opening, and
the controller is further configured to:
if the first component supply tape is present at the first transfer position, control the first transfer mechanism to discharge at least the part of the first component supply tape including the components through the third opening out of the feeder, in response to the instruction input to the input portion.

8. The component supplying device according to claim 4, wherein
the feeder further comprises a first detector configured to detect the first component supply tape at a first detection position defined in the third cavity portion between the third transfer position and the branch point, and
the controller is further configured to:
if the first detector fails to detect the first component supply tape after the control of the first transfer mechanism is completed, assume that discharge of the first component supply tape is completed; and
when it is assumed that the discharge of the first component supply tape is completed, stop controlling the third transfer mechanism.

9. The component supplying device according to claim 1, further comprising:
a display system including a display screen; and
a monitoring timer, wherein
the feeder further includes a second detector configured to detect the first component supply tape at a second detection position defined between the first transfer position and the component pick-up position, and
the controller is further configured to:
if the first component supply tape is present at the first transfer position, control the first transfer mechanism to discharge at least a part of the first component supply tape including the components passing through the component pick-up position out of the feeder, in response to the instruction input in the input system;
set the monitoring timer when the control of the first transfer mechanism is started;
if the second detector fails to detect the first component supply tape after the control of the first transfer mechanism is started, assume that the discharge of the first component supply tape is completed;
stop controlling the first transfer mechanism, when it is assumed that the discharge of the first component supply tape is completed; and
if the second detector detects the first component supply tape after a setting time preset in the monitoring timer, control the display system to display an error on the display screen.

10. A component supplying device configured to transfer first component supply tapes and second component supply tapes each including components thereon, the component supplying device comprising:
an input system configured to receive an instruction input from outside of the component supply device;
a storage storing data;
feeders each comprising:
bodies each including first sections in which first transfer positions and component pick-up positions are defined respectively and second sections in which second transfer positions are defined respectively, each of the first transfer positions being between corresponding one of the component pick-up positions and corresponding one of the second transfer position;
first transfer mechanisms disposed in the first sections; and
second transfer mechanisms disposed in the second sections; and
a controller configured to:
specify at least one of the feeders based on the data stored in the storage in response to the instruction input in the input system,
if two or more of the feeders are specified, collectively control the first transfer mechanisms of the two or more of the feeders to discharge at least parts of the first component supply tapes each including the components out of the two or more of the feeders;
when the control of the first transfer mechanisms of the two or more of the feeders is completed, collectively control the second transfer mechanisms of the two or more of the feeders to transfer second component supply tapes from the second transfer positions to the first transfer positions in the two or more of the feeders respectively; and
when the control of the second transfer mechanisms of the two or more of the feeders is completed, collectively control the first transfer mechanisms of the two or more of the feeders to transfer the second component supply tapes to the component pick-up positions in the two or more of the feeders respectively.

11. The component supplying device according to claim 10, wherein
the input system includes a button configured to be operated by an operator to input the instruction, and
the controller is further configured to:
determine whether the first component supply tape are present at the first transfer positions in all the feeders regardless of conditions thereof in the feeder after the controller receiving the instruction input from the input system.

12. The component supplying device according to claim 10, wherein
the bodies each further include tape cavities passing through the bodies at least in directions in which the first component supply tapes are transferred, the tape cavities are branched at branch points in the second sections, the tape cavities each include:
first cavity portions including first openings in first outer surfaces of the bodies at ends of the first sections, and the first cavity portions extending between the branch points and the first openings;
second cavity portions including second openings in second outer surfaces of the bodies at the second sections, the second cavity portions extending between the branch points and the second openings; and
third cavity portions including third openings in the second outer surfaces of the bodies at the second sections, the third cavity portions extending between the branch points and third openings,
the feeders each further comprise third transfer mechanisms disposed in the second sections,
the first transfer positions and the component pick-up positions are defined in the first cavity portions,
the second transfer positions are defined in the first cavity portions, third transfer positions are defined in the third cavity portions, the bodies each include through holes at the respective component pick-up positions, and the controller is further configured to:

if two or more of the feeders are specified, collectively control the first transfer mechanisms of the two or more of the feeders to transfer the first component supply tapes to the third transfer positions in the two or more of the feeders respectively, and when the control of the first transfer mechanisms of the two or more of the feeders is completed, collectively control the third transfer mechanisms of the two or more of the feeders to discharge at least the parts of the first component supply tapes each including the components out of the two or more of the feeders through the third openings in the two or more of the feeders respectively.

13. The component supplying device according to claim 10, wherein the bodies each further include tape cavities passing through the bodies at least in directions in which the first component supply tapes are transferred, the tape cavities are branched at branch points in the second sections, the tape cavities each include:

first cavity portions including first openings in first outer surfaces of the bodies at ends of the first sections, the first cavity portions extending between the branch points and the first openings;

second cavity portions including second openings in second outer surfaces of the bodies at the second sections, the second cavity portions extending between the branch points and the second openings; and third cavity portions including third openings in the second outer surfaces of the bodies at the second sections, the third cavity portions extending between the branch points and the third openings, the third openings are at bottoms of the respective second sections, the third cavity portions are sloped downward from the branch points to the third openings in the bodies respectively, the first transfer positions and the component pick-up positions are defined in the first cavity portions, the second transfer positions are defined in the second cavity portions, the bodies include through holes at the respective component pick-up positions and the controller is further configured to:

if two or more of the feeders are specified, collectively control the first transfer mechanisms of the two or more of the feeders to discharge at least the parts of the first component supply tapes including the components through the third openings out of the two or more of the feeders.

14. A surface mounting device comprising:
the component supplying device according to claim 1;
a base mount;
a component mounting device configured to mount the component that is supplied from the component pick-up position on a board that is on a component mount position of the base mount; and
a convey device configured to convey the board to the component mount position.

15. A surface mounting device comprising:
the component supplying device according to claim 2;
a base mount;
a component mounting device configured to mount the component that is supplied from the component pick-up position on a board that is on a component mount position of the base mount; and
a convey device configured to convey the board to the component mount position.

16. A surface mounting device comprising:
the component supplying device according to claim 4;
a base mount;
a component mounting device configured to mount the component that is supplied from the component pick-up position on a board that is on a component mount position of the base mount; and
a convey device configured to convey the board to the component mount position.

17. A surface mounting device comprising:
the component supplying device according to claim 7;
a base mount;
a component mounting device configured to mount the component that is supplied from the component pick-up position on a board that is on a component mount position of the base mount; and
a convey device configured to convey the board to the component mount position.

18. A surface mounting device comprising:
the component supplying device according to claim 10;
a base mount;
a component mounting device configured to mount the component that is supplied from the component pick-up position on a board that is on a component mount position of the base mount; and
a convey device configured to convey the board to the component mount position.

19. A surface mounting device comprising:
the component supplying device according to claim 11;
a base mount;
a component mounting device configured to mount the component that is supplied from the component pick-up position on a board that is on a component mount position of the base mount; and
a convey device configured to convey the board to the component mount position.

20. A surface mounting device comprising:
the component supplying device according to claim 12;
a base mount;
a component mounting device configured to mount the component that is supplied from the component pick-up position on a board that is on a component mount position of the base mount; and
a convey device configured to convey the board to the component mount position.

* * * * *